(12) United States Patent
Mizukami et al.

(10) Patent No.: US 10,535,604 B2
(45) Date of Patent: *Jan. 14, 2020

(54) STACKED MULTILAYER STRUCTURE AND MANUFACTURING METHOD THEREOF

(71) Applicant: TOSHIBA MEMORY CORPORATION, Minato-ku (JP)

(72) Inventors: Makoto Mizukami, Kawasaki (JP); Takeshi Kamigaichi, Yokohama (JP)

(73) Assignee: TOSHIBA MEMORY CORPORATION, Minato-ku (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/014,672

(22) Filed: Jun. 21, 2018

(65) Prior Publication Data

US 2018/0301415 A1 Oct. 18, 2018

Related U.S. Application Data

(63) Continuation of application No. 15/465,194, filed on Mar. 21, 2017, now Pat. No. 10,056,333, which is a (Continued)

(30) Foreign Application Priority Data

Jun. 29, 2007 (JP) ................................. 2007-173445

(51) Int. Cl.
*H01L 23/528* (2006.01)
*H01L 27/11578* (2017.01)
(Continued)

(52) U.S. Cl.
CPC ...... *H01L 23/5283* (2013.01); *H01L 21/0217* (2013.01); *H01L 21/76805* (2013.01);
(Continued)

(58) Field of Classification Search
CPC ........................ H01L 27/11575; H01L 27/1157
See application file for complete search history.

(56) References Cited

U.S. PATENT DOCUMENTS 5,599,724 A 2/1997 Yoshida
5,707,885 A 1/1998 Lim
(Continued)

FOREIGN PATENT DOCUMENTS

JP 60-70743 4/1985
JP 5-21611 1/1993
(Continued)

OTHER PUBLICATIONS

Tetsuo Endoh, et al., "Novel Ultrahigh-Density Flash Memory With a Stacked-Surrounding Gate Transistor (S-SGT) Structured Cell", IEEE Transactions on Electron Devices, vol. 50, No. 4, Apr. 2003, pp. 945-951.

(Continued)

*Primary Examiner* — Yu-Hsi D Sun
(74) *Attorney, Agent, or Firm* — Oblon, McClelland, Maier & Neustadt, L.L.P.

(57) ABSTRACT

A stacked multilayer structure according to an embodiment of the present invention comprises: a stacked layer part including a plurality of conducting layers and a plurality of insulating layers, said plurality of insulating layers being stacked alternately with each layer of said plurality of conducting layers, one of said plurality of insulating layers being a topmost layer among said plurality of conducting layers and said plurality of insulating layers; and a plurality of contacts, each contact of said plurality of contacts being formed from said topmost layer and each contact of said plurality of contacts being in contact with a respective conducting layer of said plurality of conducting layers, a side surface of each of said plurality of contacts being (Continued)

insulated from said plurality of conducting layers via an insulating film.

16 Claims, 34 Drawing Sheets

Related U.S. Application Data continuation of application No. 14/996,071, filed on Jan. 14, 2016, now Pat. No. 9,640,547, which is a continuation of application No. 14/252,024, filed on Apr. 14, 2014, now Pat. No. 9,257,388, which is a continuation of application No. 14/057,878, filed on Oct. 18, 2013, now Pat. No. 8,742,586, which is a continuation of application No. 12/948,412, filed on Nov. 17, 2010, now Pat. No. 8,664,108, which is a continuation of application No. 12/163,145, filed on Jun. 27, 2008, now Pat. No. 7,855,457.

(51) Int. Cl.
| | |
|---|---|
| *H01L 27/1157* | (2017.01) |
| *H01L 27/06* | (2006.01) |
| *H01L 27/10* | (2006.01) |
| *H01L 27/102* | (2006.01) |
| *H01L 27/24* | (2006.01) |
| *H01L 21/768* | (2006.01) |
| *H01L 23/522* | (2006.01) |
| *H01L 21/02* | (2006.01) |
| *H01L 27/11556* | (2017.01) |
| *H01L 45/00* | (2006.01) |

(52) U.S. Cl.
CPC .. *H01L 21/76816* (2013.01); *H01L 21/76831* (2013.01); *H01L 21/76883* (2013.01); *H01L 23/528* (2013.01); *H01L 23/5226* (2013.01); *H01L 27/0688* (2013.01); *H01L 27/101* (2013.01); *H01L 27/1021* (2013.01); *H01L 27/1157* (2013.01); *H01L 27/11556* (2013.01); *H01L 27/11578* (2013.01); *H01L 27/24* (2013.01); *H01L 45/06* (2013.01); *H01L 2924/0002* (2013.01); *Y10T 156/1057* (2015.01)

(56) References Cited

U.S. PATENT DOCUMENTS

| | | | |
|---|---|---|---|
| 7,910,914 | B2 | 3/2011 | Tanaka et al. |
| 2002/0154556 | A1 | 10/2002 | Endoh et al. |
| 2003/0146515 | A1 | 8/2003 | Kajiyama |
| 2004/0232460 | A1 | 11/2004 | Kajiyama |
| 2006/0091556 | A1 | 5/2006 | Shigeoka |
| 2007/0252201 | A1 | 11/2007 | Kito et al. |
| 2008/0067583 | A1 | 3/2008 | Kidoh |
| 2008/0099819 | A1 | 5/2008 | Kito |
| 2008/0186771 | A1* | 8/2008 | Katsumata ......... G11C 16/0483 365/185.17 |
| 2009/0097309 | A1 | 4/2009 | Mizukami et al. |
| 2010/0006922 | A1 | 1/2010 | Matsuoka et al. |

FOREIGN PATENT DOCUMENTS

| | | |
|---|---|---|
| JP | 2003-78044 | 3/2003 |
| JP | 2004-266220 | 9/2004 |
| JP | 2006-128390 | 5/2006 |

OTHER PUBLICATIONS

Japanese Office Action dated Jan. 10, 2012, in Patent Application No. 2007-173445 (with Partial English-language translation).

Office Action dated Mar. 27, 2012, in Japanese Patent Application No. 2007-173445, filed Jun. 29, 2007 (w/English-language Translation).

* cited by examiner

STACKED MULTILAYER STRUCTURE AND MANUFACTURING METHOD THEREOF

CROSS-REFERENCE TO RELATED APPLICATIONS

This application is a continuation of U.S. application Ser. No. 15/465,194 filed Mar. 21, 2017, which is a continuation of U.S. application Ser. No. 14/996,071 filed Jan. 14, 2016, which is a continuation of U.S. application Ser. No. 14/252,024 filed Apr. 14, 2014, which is a continuation of U.S. application Ser. No. 14/057,878 filed Oct. 18, 2013, which is a continuation of U.S. application Ser. No. 12/948,412 filed Nov. 17, 2010, which is a continuation of U.S. application Ser. No. 12/163,145 filed Jun. 27, 2008, and is based upon and claims the benefit of priority from the prior Japanese Patent Application No. 2007-173445, filed on Jun. 29, 2007; the entire contents of which are incorporated herein by reference.

BACKGROUND OF THE INVENTION

Field of the Invention

The present invention is related to a stacked multilayer structure, a manufacturing method thereof, and a semiconductor device using said stacked multilayer structure.

Description of the Related Art

The demand for miniature and large capacity nonvolatile semiconductor devices is increasing. In order to realize this miniaturization and large scale capacity, a number of devices in which semiconductor elements such as memory cell transistors are arranged three dimensionally have been proposed. For example, such devices are disclosed in the United States Patent Publication No. US-20020154556-A1, the U.S. Pat. Nos. 5,599,724, 5,707,885, and Masuoka et al, "Novel Ultrahigh-Density Flash Memory With a Stacked-Surrounding Gate Transistor (S-SGT) Structured Cell" IEEE TRANSACTIONS ON ELECTRON DEVICES, Vol. 50, N04, pp945-951, April 2003.

In such devices in which semiconductor elements and the like are arranged three dimensionally, a plurality of conducting layers are stacked to form a stacked multilayer structure, each of said plurality of conducting layers being connected to several electrodes of said elements positioned on the same layer. And there is a need to connect each, of said plurality of conducting layers to a driving circuit. Thereupon, there is a need to form efficiently these connection structures while keeping their reliability.

BRIEF SUMMARY OF THE INVENTION

A stacked multilayer structure according to an embodiment of the present invention comprises: a stacked layer part including, a plurality of conducting layers and a plurality of insulating layers, said plurality of insulating layers being stacked alternately with each layer of said plurality of conducting layers, one of said plurality of insulating layers being a topmost layer among said plurality of conducting layers and said plurality of insulating layers; and a plurality of contacts, each contact of said plurality of contacts being formed from said topmost layer and each contact of said plurality of contacts being in contact with a respective conducting layer of said plurality of conducting layers, a side surface of each of said plurality of contacts being insulated from said plurality of conducting layers via an insulating film.

A nonvolatile semiconductor device according to an embodiment of the present inventioncomprises: a stacked layer part including a plurality of conducting layers, a plurality of insulating layers and a plurality of semiconductor pillars, said plurality of insulating layers being stacked alternately with each, layer of said plurality of conducting layers, one of said plurality of insulating layers being a topmost layer among said plurality of conducting layers and said plurality of insulating layers, and each of said plurality of semiconductor pillars having a nonvolatile memory cell around the section of penetration into each of said plurality of conducting layers; a plurality of contacts, each contact of said plurality of contacts being formed from said topmost layer and each contact of said plurality of contacts being in contact with a respective conducting layer of said plurality of conducting layers, a side surface of each of said plurality of contacts being insulated from said plurality of conducting layers via an insulating film; and a driving circuit being connected to each of said plurality of conducting layers respectively via said plurality of contacts.

A manufacturing method according to an embodiment of the present invention of a stacked multilayer structure comprises: stacking, a conducting layer and a plurality of insulating layer alternately, one of said insulating layer being a topmost layer among a plurality of insulating layers and a plurality of conducting layers; forming a plurality of contact holes, each of said plurality of contact holes being in contact with a top surface of said conducting layers respectively from said topmost layer; forming an insulating film on a side surface of said plurality of contact holes; and forming contacts by depositing conducting material inside said plurality of contact holes.

DETAILED DESCRIPTION OF THE INVENTION

Figure 1:
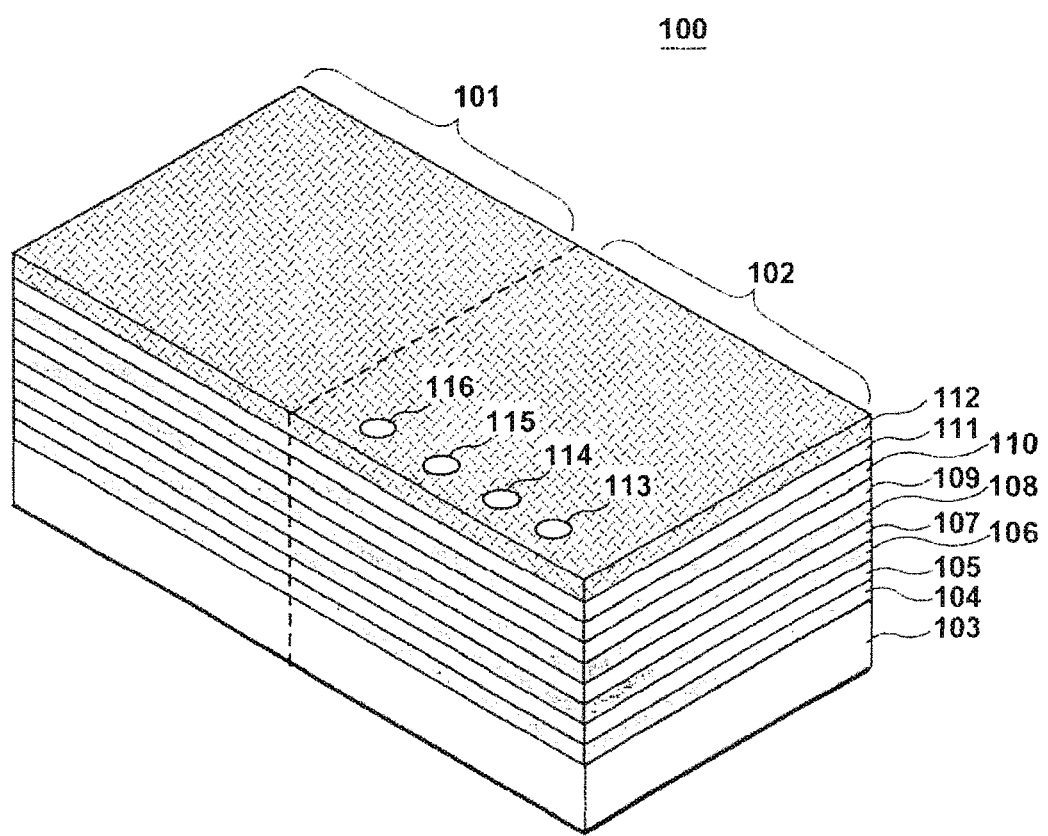
FIG. 1 shows an outline of an external view of a stacked multilayer structure related to one embodiment of the present invention.

Now, embodiments of a stacked multilayer structure, its manufacturing method thereof, and a semiconductor device using said stacked multilayer structure of the present invention will be described in detail with reference to the drawings. Furthermore, the present invention is not limited to these embodiments. A variety of embodiments are possible. In addition, because identical reference numerals are used to the same constituents, some explanations of which will be omitted from the description.

First Embodiment

FIG. 1 shows an outline drawing of an external aspect of a semiconductor device related to one embodiment of the present invention. The semiconductor device 100 includes a stacked layer part in which conducting layers and insulating layers are alternately stacked. The stacked layer part may be arranged with an element region 101 and a contact region 102. The element region 101 is a region in which semiconductor elements exist. These semiconductor elements are formed after the conducting layers and the insulating layers are alternately stacked. However, the conducting layers, the insulating layers, and the semiconductor elements may be formed in any order.

In addition, even in the case where the semiconductor device includes no element region 101, the semiconductor device can be regarded as including a stacked multilayer structure related to one embodiment of the present invention. In other words, it is also possible to identify the contact region 101 as a stacked multilayer structure related to one embodiment of the present invention.

The contact region 102 is a region in which contacts for electrically connecting each conducting layer to a wire, which are not shown in the drawing and positioned on or above the topmost layer 112. Furthermore, such wire may be connected to, for example, a driving circuit, which is also not shown in the drawing. Here, the topmost layer 112 need not to be literally topmost. As explained here, above the topmost layer 112, there may be another layer. The 'topmost' of 'the topmost layer 112' may mean that the layer is uppermost when forming contacts.

The semiconductor device 100 includes, for example, a substrate layer 103 located at the bottom and, above the substrate 103 an insulating layer 104, a conducting layer 105, an insulating layer 106, a conducting layer 107, an insulating layer 108, a conducting layer 109, an insulating layer 110, a conducting layer 111, and an insulating layer 112 are stacked alternately in this order. The insulating layers 104, 106, 108, and 110 are formed, for example, as silicon oxide films and the conducting layers 105, 107, 109, and 111 are formed, for example, as polysilicon films or as amorphous silicon films in which conducting impurities such as phosphorus have been doped. In addition, the topmost insulating layer 112 may be formed by a different material from the other insulating layers 104, 106, 108 and 110, so that it may also function as a protection layer. Of course, there is no need to form the insulating layers 104, 106, 108 and 110 by depositing the same material and the thickness of each layer may also be different. In addition, there is no need to form the conducting layers 105, 107, 109 and 111 by depositing the same material and the thickness of each layer may also be different.

The contacts 113, 114, 115 and 116, which have been formed in the contact holes, exist in the contact region 102. For example, the contact 113 has been formed by a photo etching process for forming a contact hole which reaches the conducting layer 105 and following the formation of the contact hole, an insulating film forming process of the other conducting layers 107, 109, and 111 is performed so that the contact 113 can be connected electrically only to the bottom conducting layer 105. The forming process of the contact 113 is completed by depositing silicon which has been doped with phosphorus or a metal contact plug such as tungsten in the contact hole. Similarly, the contact 114 has been formed so that it is connected electrically with only with the conducting layer 107, the contact 115 is formed so that it is connected electrically only with the conducting layer 109, and the contact 116 is formed so that it is connected electrically only with the conducting layer 111.

Figure 2:
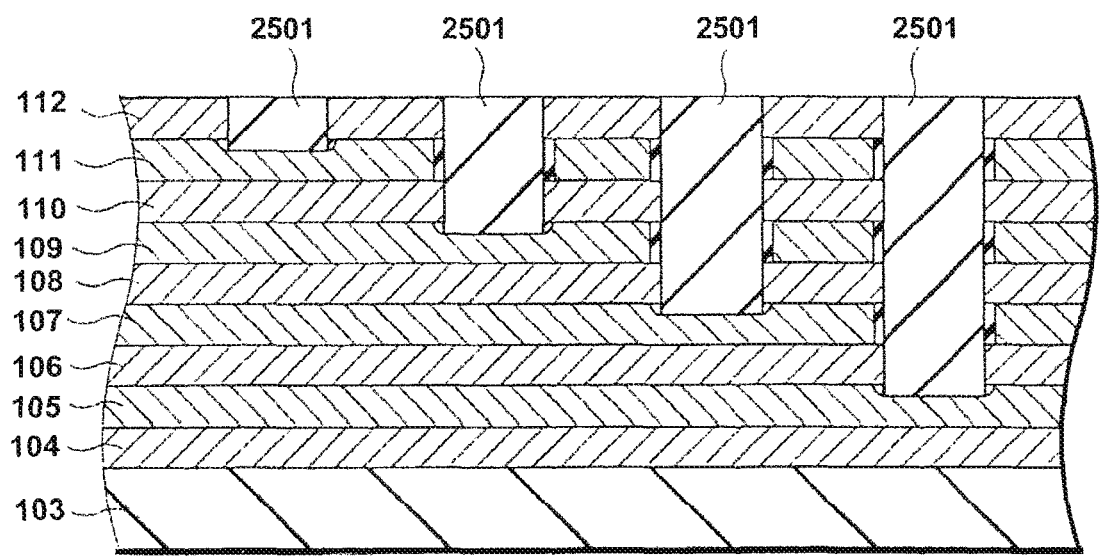
FIG. 2 shows a cross sectional diagram of a stacked multilayer structure related to one embodiment of the present invention.

FIG. 2 is a cross sectional diagram of the contact region 102. That is, FIG. 2 shows a cross section along with a line passing roughly through the centers of the contacts 113, 114, 115, and 116. The substrate layer 103 is arranged at the bottom and above this substrate layer 103, the insulating layer 104, the conducting layer 105, the insulating layer 106, the conducting layer 107, the insulating layer 108, the conducting layer 109, the insulating layer 110, the conducting layer 111, and the insulating layer 112 are stacked alternately in this order. The four contacts 2501 are shown in FIG. 2. So it can be considered, for example, that from the right hand side to the left hand side each of the contacts 2501 corresponds to each of the contacts 113, 114, 115, and 116, which are shown in FIG. 1.

Each conducting layer at the bottom of each of the contacts 2501 is connected electrically with each contact. Alternatively, the part of the conducting layer at the side surface of each of contacts 2501 is insulated from each contact by the oxidization process etc. That is, there is an insulating film between the side surface of each of the contact 2501 and each conducting layer above the bottom conducting layer of each contact. As a result, the conducting layers apart from the conducting layer which is at the bottom of each of the contacts 2501 are insulated from the contacts 2501. Furthermore, although the side surfaces of each of the contacts 2501 are shown to be perpendicular to the substrate layer 103, as will be described later, they are not limited to be perpendicular to the substrate layer 103.

Figure 3:
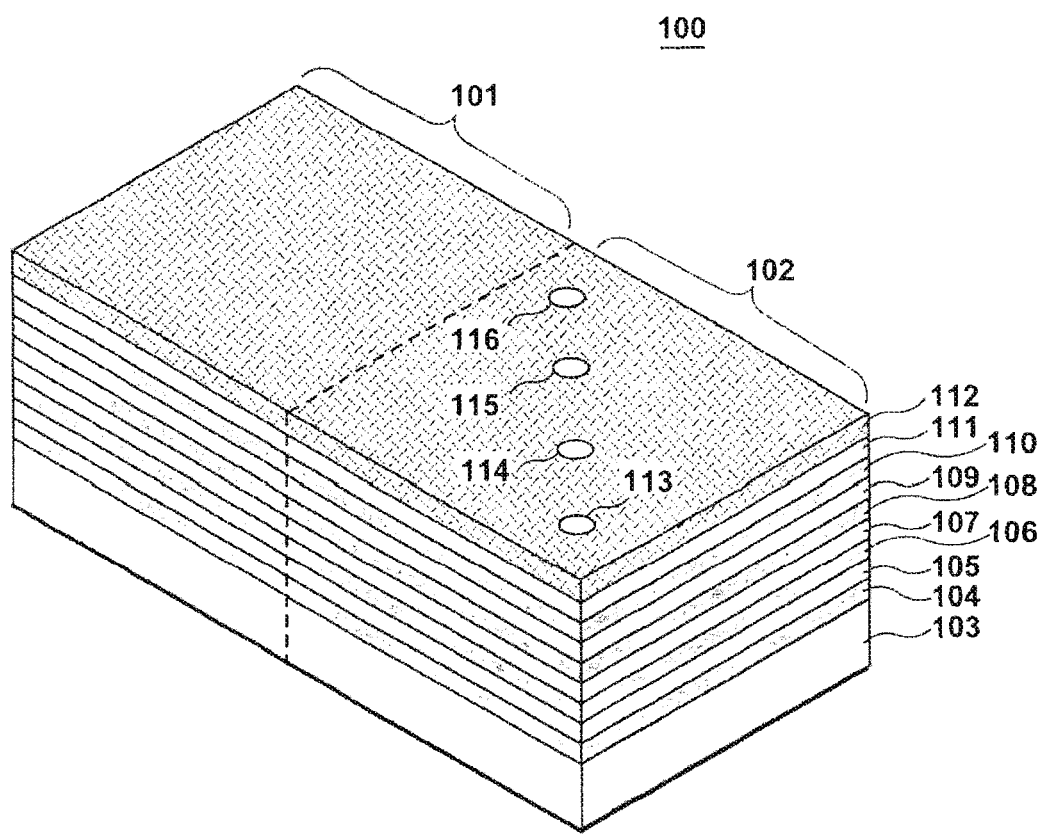
FIG. 3 shows an outline of an external view of a stacked multilayer structure related to one embodiment of the present invention.

There are a number of varying arrangements of the contacts in a stacked multilayer structure and a semiconductor device related to one embodiment of the present invention. For example, in FIG. 3, the contacts 113, 114, 115, and 116 are arranged in a diagonal line at a 45 degree angle to the element region 101. Alternatively, in FIG. 1, the contacts 113, 114, 115, and 116 are arranged in a line at a 90 degree angle to the element region 101. By arranging the contacts 113, 114, 115, and 116 as FIG. 3, it is possible to increase the distance between contacts compared with the arrangement shown in FIG. 1. As a result, it is possible to prevent a contact hole from connecting with other contact hole at the time of contact hole formation. In addition, it is also possible to reduce the width of the contact region compared with that in FIG. 1.

Figure 4:
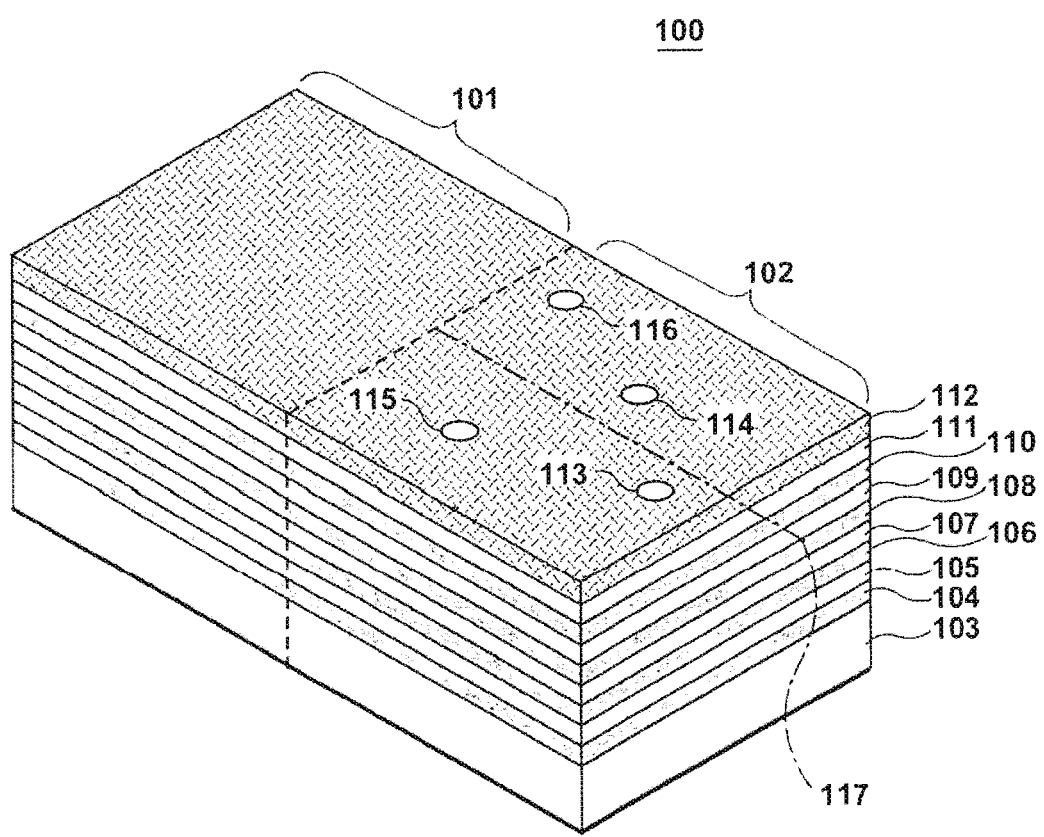
FIG. 4 shows an outline of an external view of a stacked multilayer structure related to one embodiment of the present invention.

Also, a contact may be placed at any place in the contact region 102. For example, as shown in FIG. 4, the contacts 113, 114, 115, and 116 may be arranged on both sides of the line 117, which may be virtually drawn at the center of the contact region 102. In FIG. 4, each of the contacts 113, 114, 115, and 116 is placed at each peak of a triangle wave, the amplitude of which is gradually changing. In other words, the contacts 113 and 115 are placed on one side of the line 117 and the contacts 114 and 116 are placed on the other side of the line 117 in a zig, zag shape so that the closer to the element part 104 the contact hole is, the larger the distance between the contact and the line 117 becomes. The contacts may be also arranged so that the closer to the element part 104 the contact hole is the smaller the distance between the contact and the line 117 becomes. Furthermore, each of the contacts may be placed at each peak of a sawtooth wave instead of a triangle wave. By arranging the contacts in one of such ways, it is possible to increase the distance between contacts compared with that in FIG. 2 or FIG. 3. As a result, as well as being able to prevent a contact hole from connecting with other contact hole at the time of contact hole formation, it is also possible to reduce the width of the contact region compared to that in FIG. 1 or FIG. 3. Furthermore, the line 117 may be a straight line which extends in a perpendicular direction to the contact region 102 to the border between the element region 101 and the contact region 102, but it needs not to be restricted to this case.

Figure 5:
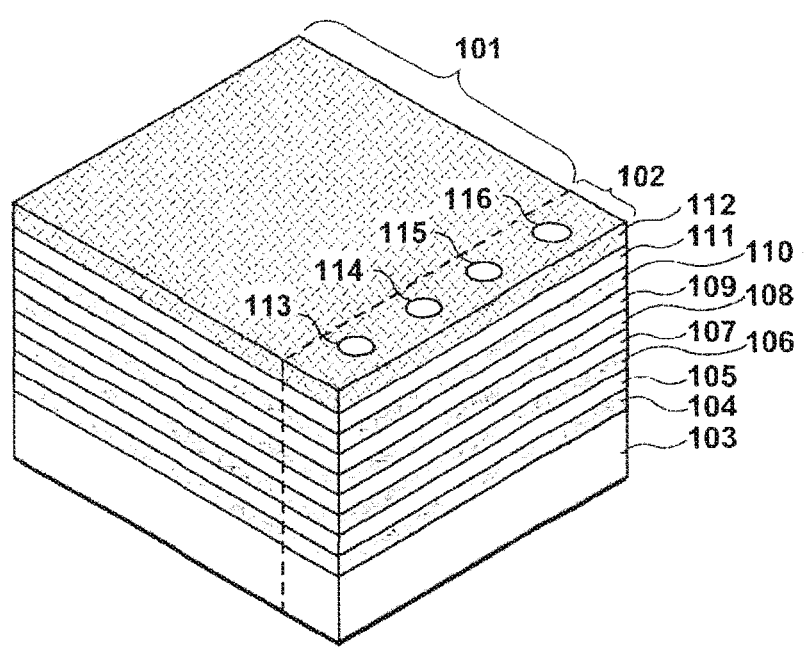
FIG. 5 shows an outline of an external view of a stacked multilayer structure related to one embodiment of the present invention.

In addition, for example, the contacts 113, 114, 115, and 116 in FIG. 5 are arranged in a line substantially parallel to the element region 101. In other words, they are arranged in a line which parallels the border between the element region 101 and the contact region 102, or they are arranged in a line which parallels the outside edge of the contact region 102. By arranging the contacts in a line which parallels a border as described here it is possible to reduce the depth (the distance between the border of the element region and the contact region and the edge opposite to the border of the contact region) of the contact region compared with that in FIG. 3 or FIG. 4.

Figure 6:
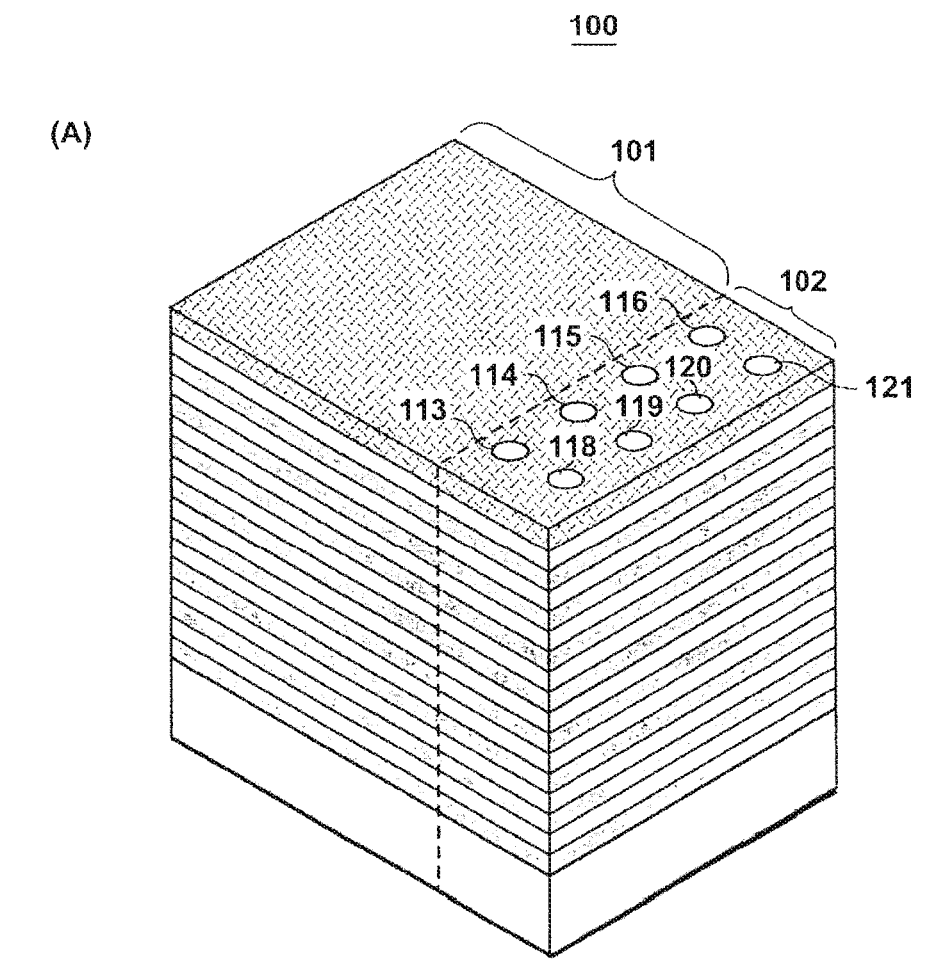
FIG. 6 shows an outline of an external view of a stacked multilayer structure related to one embodiment of the present invention.
Figure 6:
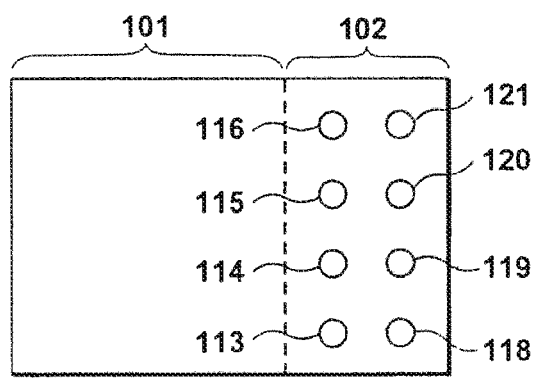
Figure 6:
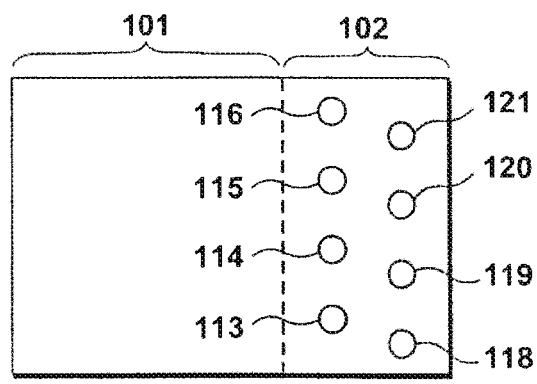

In addition, for example, in FIG. 6 (A), in addition to the contacts 113, 114, 115, and 116, the contacts 118, 119, 120 and 121 are arranged. These contacts are arranged in two lines which parallel the border between the element region 101 and the contact region 102, or they are arranged in two lines which parallel the outside edge of the contact region 102. Furthermore these contacts may be arranged in a grid shape. By arranging the contacts in two lines or more which parallel a border as describe here it is possible to arrange the contacts in a narrower or smaller contact region even in the case where there are eight conducting layers as shown in FIG. 6 (A). For example, the contact 113 is in contact with the bottom conducting layer. Then, the contacts 114, 115, 116, 118, 119, 120, and 121 can be connected to corresponding conducting layers in this order from the substrate to the topmost layer.

FIG. 6 (B) is a diagram showing a top view of the semiconductor device 100 shown in FIG. 6 (A). As is shown in FIG. 6 (B), the line of contacts 113, 114, 115, 116 and the line of the contacts 118, 119, 120, 121, and the line of the contacts 113 and 118, the line of the contacts 114 and 119, the line of the contacts 115 and 120 and the line of the contacts 116 and 121 form square shapes or rectangle shapes. In other words, the edges connecting the contacts 118, 113, 119, 114, 120, 115, 121, and 116 form a sawtooth wave.

In addition, as is shown in FIG. 6 (C), the row of contacts 113, 114, 115, 116 and the row of contacts 118, 119, 120, 121 which are arranged in a line which parallels the border between the element region 101 and the contact region 102, may be slightly misaligned by about half the distance between two contacts in the same row. In addition, the shape may also be a trapezium. In other words, the shape which has been explained above may be a rhomboid or a parallelogram. In other words, the edges connecting the contacts 118, 113, 119, 114, 120, 115, 121, and 116 form a triangle wave. By arranging the contacts in a line in this way it is possible to arrange them in a smaller region.

Furthermore, FIG. 1, FIG. 3, FIG. 4, FIG. 5 and FIG. 6 show a rough external view of a semiconductor device or a stacked multilayer structure related to one embodiment of the present invention as an example and there is no need for a semiconductor device and a stacked multilayer structure related to one embodiment of the present invention to have rectangular parallelepiped shapes. A semiconductor device and a stacked multilayer structure related to one embodiment of the present invention may have arbitrary three dimensional shapes. In addition, in the case where there is an element region 101, there is no need for the border between the element region and contact region to be a straight line when a semiconductor device or a stacked multilayer structure related to one embodiment of the present invention is viewed from above and a semiconductor device and a stacked multilayer structure related to one embodiment of the present invention may have an arbitrary two dimensional shape. In addition, the element region may be formed by a plurality of regions. This is also the same for the contact region. Furthermore, the number of conducting layers is not limited to four and can be eight, sixteen, or an arbitrary number.

Second Embodiment

Figure 7:
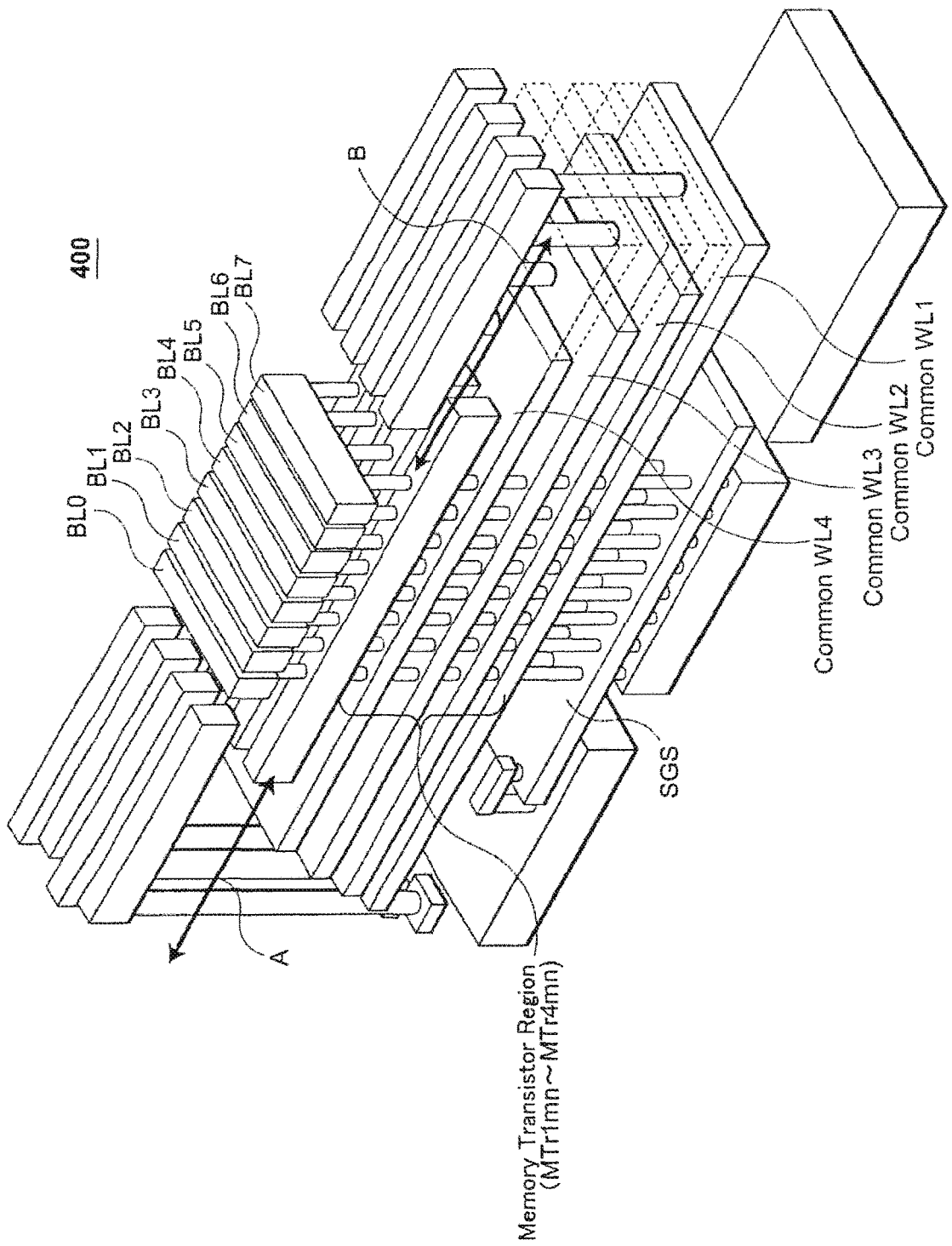
FIG. 7 shows an outline structure of a nonvolatile semiconductor memory device which uses a stacked multilayer structure related to one embodiment of the present invention.

FIG. 7 shows a rough structural view of a nonvolatile semiconductor device which uses a stacked multilayer structure related to the second embodiment of the present invention. The nonvolatile semiconductor device 400 includes a structure in which a first insulating film, an electron accumulation film, a second insulating film, and a gate electrode are formed in this order around each of semiconductor pillars so that each semiconductor pillar can form a memory string connecting memory transistors in series, said semiconductor pillars being arranged in a matrix shape. The nonvolatile semiconductor device 400 has four stacked conducting layers, each layer connecting the gate electrodes of the memory transistors at a same level of the semiconductor pillars. Although it has been omitted in the diagram in FIG. 7, there is an insulating layer above and below these conducting layers. A region where memory transistors are stacked around semiconductor pillars, which are substantially perpendicular to the bottom substrate, corresponds to the element region 101 shown in FIG. 1, FIG. 3, FIG. 4, FIG. 5, or FIG. 6. Although the nonvolatile semiconductor device 400 shown in FIG. 7, the Common WL1, the Common WL2, the Common WL3, and the Common WL4, which are plate shaped and form the conducting layers in the region B, have parts drawn in dotted lines, these dotted lines are for descriptive purposes. That is, these dotted lines are for explaining the structure of the contacts connected to the plate shaped Common WL1, the Common WL2, the Common WL3, and the Common WL4 in the present embodiment. Actually, the Common WL2, the Common WL3 and the Common WL4 extend to the right of region B similarly as Common WL1 extends. In other words, the Common WL1, the Common WL2, the Common WL3, and the Common WL4 correspond to the conducting layers 105, 107, 109 and 111 in FIG. 1, FIG. 3, FIG. 4, FIG. 5 or FIG. 6. In addition, the insulating layer of the layer under the Common WL1, each insulating layer among the Common WL1, the Common WL2, Common WL3, and Common WL4 and the insulating layer on the Common WL4 correspond to the insulating layers 104, 106, 108, 110 and 112.

In the nonvolatile semiconductor device 400, which is shown in FIG. 7, four contact holes have been formed so that the four contact holes respectively can reach the Common WL1, the Common WL2, the Common WL3, and Common WL4 respectively, four contacts which contact with the Common WL1, the Common WL2, the Common WL3, and the Common WL4 have been formed, and a word line driving circuit which is not illustrated in the drawing is connected to each of the Common WL1, the Common WL2, the Common WL3, and the Common WL4.

Figure 8:
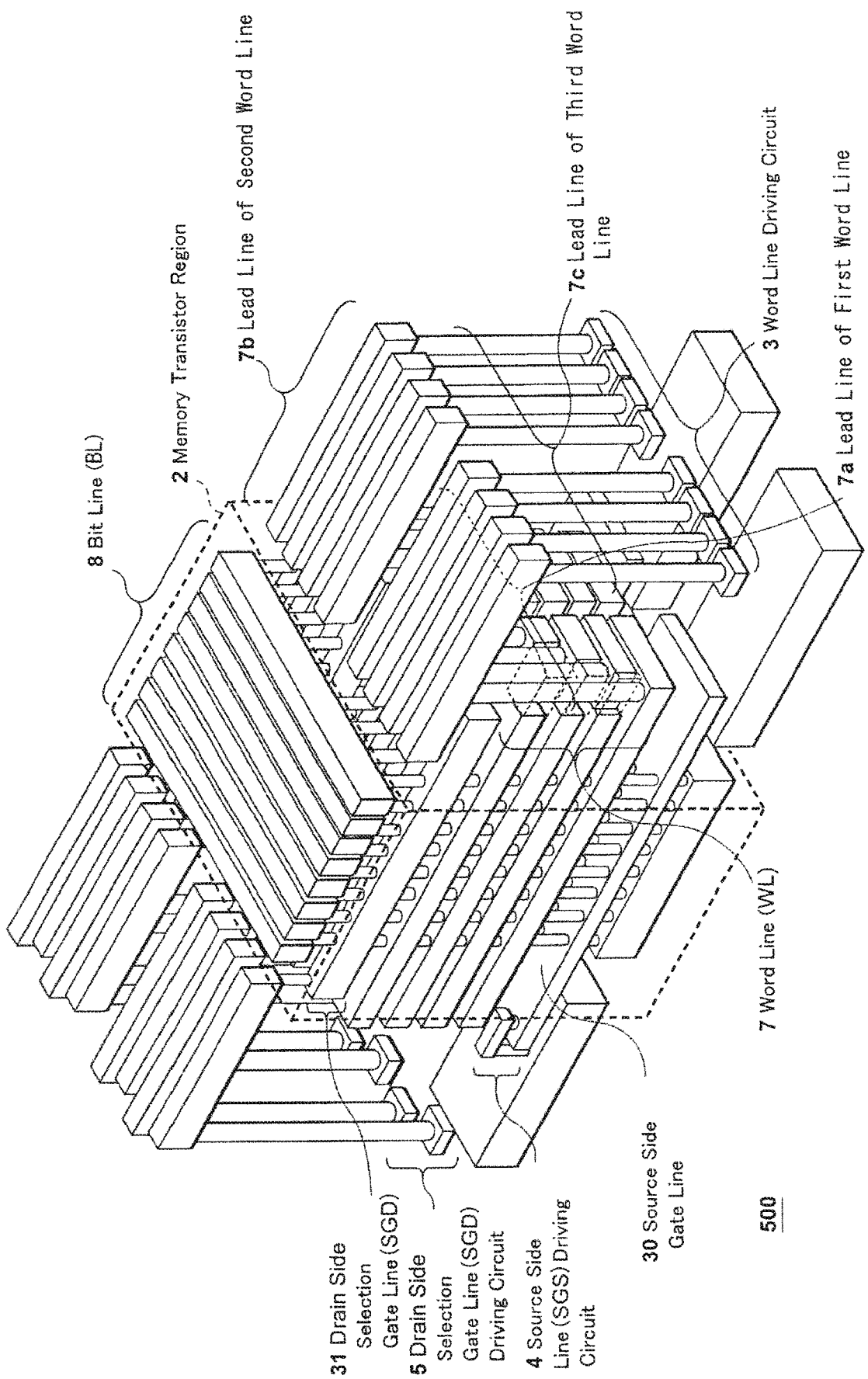
FIG. 8 shows an outline structure of a nonvolatile semiconductor memory device which uses a stacked multilayer structure related to one embodiment of the present invention.

FIG. 8 shows a rough structural view of another nonvolatile semiconductor device which uses a stacked multilayer structure related to one embodiment of the present invention. The nonvolatile semiconductor device 500 includes a memory transistor region 2, a word line driving circuit 3, a source side selection gate line driving circuit 4, a drain side selection gate line driving circuit 5, a bit line (BL) 8, a source side selection gate line 30 and a drain side selection gate line 31. Similarly to the nonvolatile semiconductor device shown in FIG. 7, the memory transistor region 2 includes a structure in which a first insulating film, an electron accumulation film, a second insulating film, and a gate electrode are formed in this order around each of semiconductor pillars so that each semiconductor pillar can form a memory string connecting memory transistors in series, said semiconductor pillars being arranged in a matrix shape. The memory transistor region 2 corresponds to the element region 101 of the stacked multilayer structure 100. Also, the word lines WL7 of the nonvolatile semiconductor device 500 are formed substantially parallel each other in, the memory transistor region 2 and each contact connects electrically each word line to each second word line lead line 7b. Here, the word lines WL7 have the parts drawn in dotted lines. These dotted lines are for descriptive purposes as in FIG. 7. Each word line which is shown as word line WL7 corresponds to the conducting layers 105, 107, 109, and 111 shown in FIG. 1, FIG. 3, FIG. 5, and FIG. 6. The layer immediately below the bottom word line WL7, each layer between the word lines WL7 and the layer immediately above the topmost word line WL7 corresponds to the insulating layers 104, 106, 108, 110, and 112.

Third Embodiment

A manufacturing process of a stacked multilayer structure related to the third embodiment of the present invention is explained below with reference to FIG. 9 to FIG. 16. A stacked multilayer structure related to the third embodiment of the present invention can be applied to the semiconductor devices such as those explained in the second embodiment of the present invention.

Figure 9:
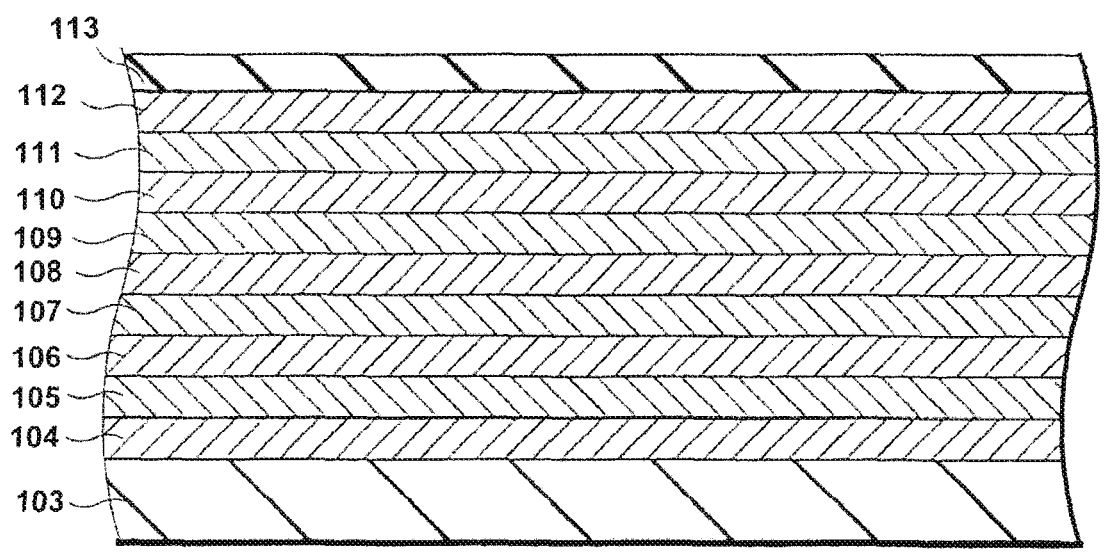
FIG. 9 is a diagram for explaining the formation of a stacked multilayer structure related to one embodiment of the present invention.

As is shown in FIG. 9, for example, a stacked multilayer structure of an embodiment of the present invention includes an insulating layer 104, a conducting layer 105, an insulating layer 106, a conducting layer 107, an insulating layer 108, a conducting layer 109, an insulating layer 110, a conducting layer 111, and an insulating layer 112 stacked above a substrate layer 103 alternately in this order. Furthermore, there is no need for the entire substrate layer 103 to have a uniform structure. A variety of semiconductor elements can be formed in a certain part of the substrate layer to form an element region above said region. For example, there may be a region in the substrate layer 103 in which SGS or the source side selection gate 30 are formed as shown in FIG. 7 and FIG. 8. In addition, another insulating layer having a different material from the insulating layer 112 can be formed above the insulating layer 112. This insulating layer may function as a protection layer.

Similarly, there is no need for all the insulating layers and the conducting layers which are stacked above the substrate layer 103 to have a uniform structure. For example, it is possible to arrange an element region (not shown in the drawing) such as that shown in FIG. 7 and FIG. 8 being positioned on, the left side or the right side of the stacked multilayer structure shown in FIG. 9. Alternatively, the element region may be positioned before or after the stacked multilayer structure shown in FIG. 9.

A photoresist 113 is deposited above the insulating layer 112, which is the topmost layer, in order to form a contact hole as explained below. A positive type and a negative type resist are known as two photoresist types. Usually, it is possible to increase the resolution by using a positive resist whereas a negative resist has good adhesive properties. Because a contact hole which is formed in an embodiment of the present invention has often a large aspect ratio to reach a semiconductor layer which is not adjacent to the topmost layer, the negative resist is preferably used.

Figure 10:
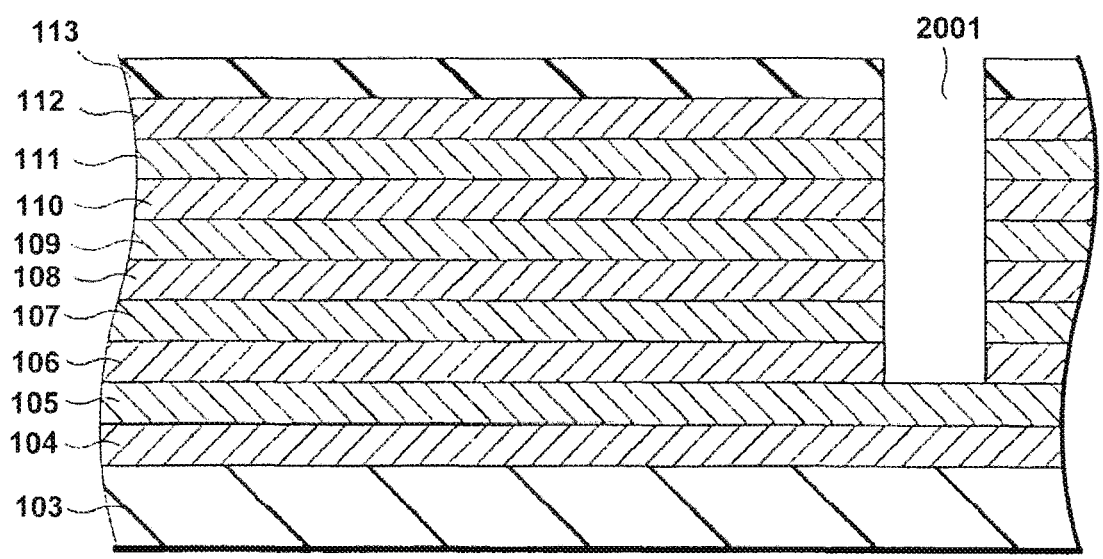
FIG. 10 is a diagram for explaining the formation of a stacked multilayer structure related to one embodiment of the present invention.

In order to form the contact hole which reaches the bottom conducting layer 105, a photolithography process is performed. Namely, a photoresist is formed as a contact hole pattern and an etching process, for example RIE (Reactive Ion Etching) is performed using a mask formed by this photo resist. In this way, the contact hole 2001, which reaches the conducting layer 105 is formed as shown in FIG. 10. Here, an over-etching process may be performed so that the conducting layer and the contact formed in the contact hole can be surely electrically connected. As a result, the bottom surface of this contact hole may be formed not only reaching on the surface of the conducting layer but may also be formed into the conducting layer. Following this, the photoresist 113 is removed.

Figure 11:
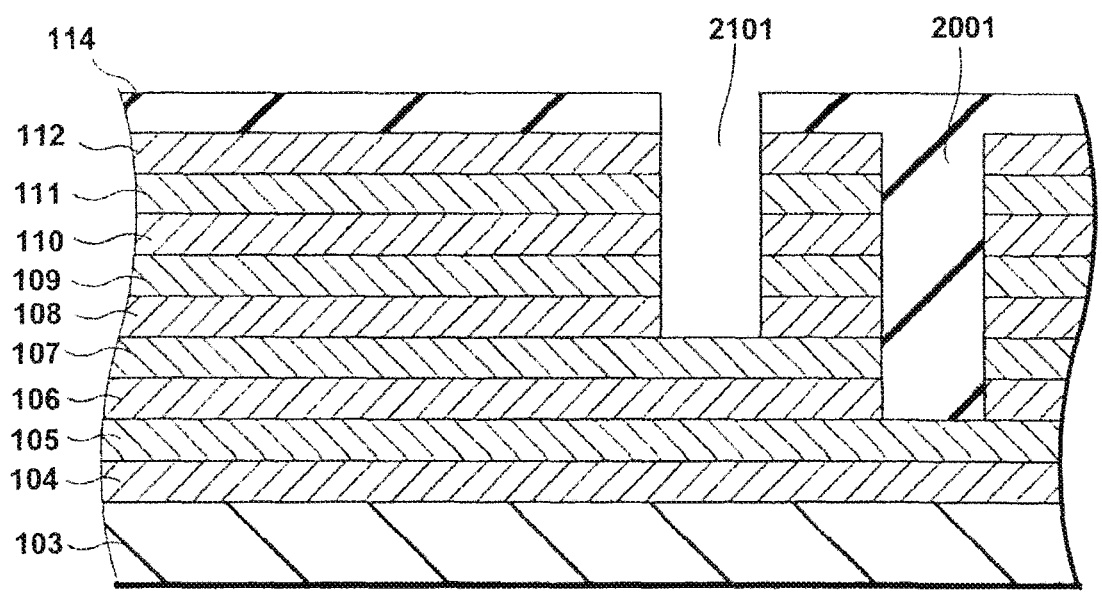
FIG. 11 is a diagram for explaining the formation of a stacked multilayer structure related to one embodiment of the present invention.

Next, in order to form another contact hole, another photolithography process is performed. To prevent the contact hole 2001 being etched further the entire upper surface on which the contact hole 2001 appears is deposited by the photoresist 114. Following this, the photo resist is 114 is patterned, a pattern of the contact holes which are connected to the conducting layer 107 is formed and the etching process is performed using a mask formed on the photoresist 114. In this way, as shown in FIG. 11, the contact hole 2101 which reaches the conducting layer 107 is formed. Following this, this photoresist is removed.

A process such as that explained above is repeated and as shown in FIG. 12, and the contact holes 2201 and 2202 which reach the conducting layers 109 and 111 respectively, are formed.

Furthermore, according to the above explanation, the order of forming the contact holes begins by forming the contact hole which reach the bottom conducting layer 105. However, the order of forming the contact holes may be arbitrary. However, as explained above, by forming deeper contact holes earlier, deeper contact holes are filled with photoresist when shallower contact holes are being formed, and the risk in which photoresist in any contact hole disappears while etching. In this way, it is possible to prevent any contact hole from penetrating through to lower conducting layers.

In addition, by forming a contact hole pattern on a silicon nitride film by using lithography, it is also possible to use what is called a hard mask. In this case, a positive photoresist, which has a high resolution property, may be used.

Figure 13:
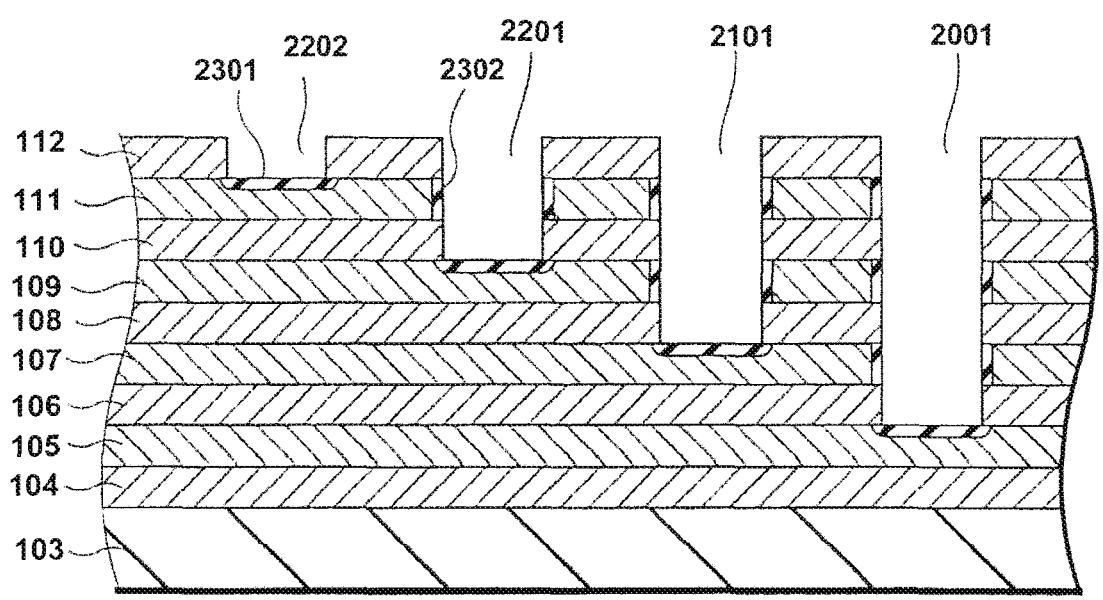
FIG. 13 is a diagram for explaining the formation of a stacked multilayer structure related to one embodiment of the present invention.
Figure 14:
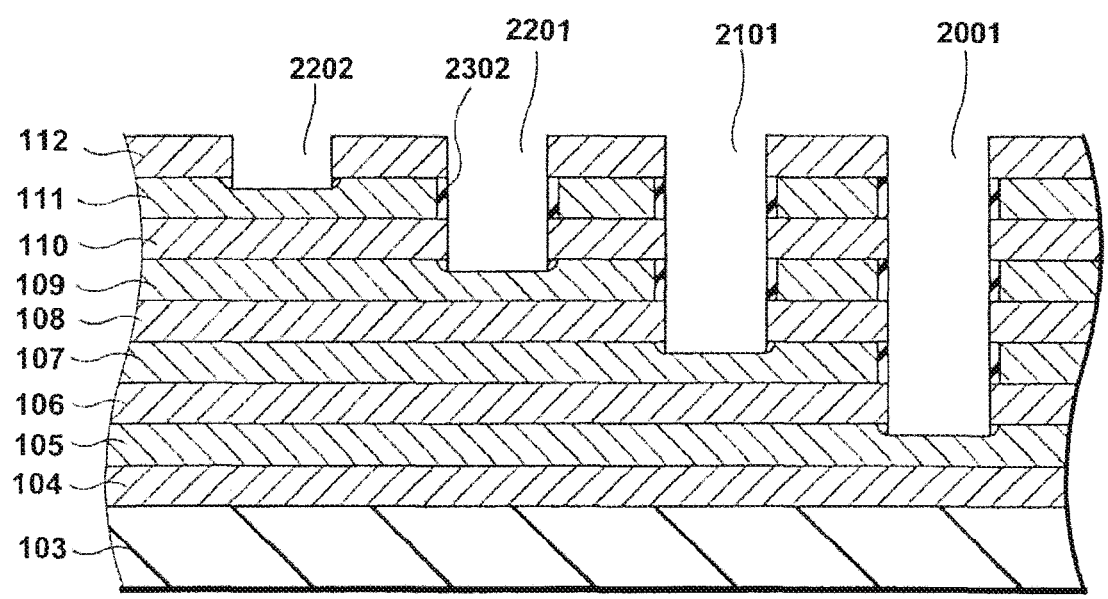
FIG. 14 is a diagram for explaining the formation of a stacked multilayer structure related to one embodiment of the present invention.
Figure 15:
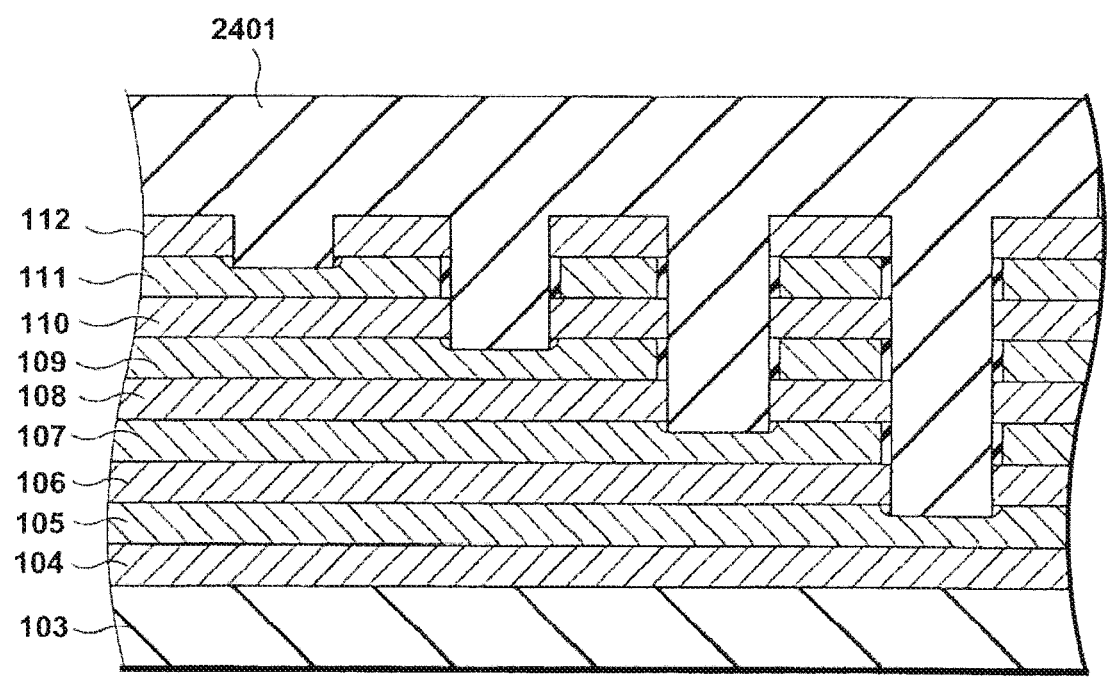
FIG. 15 is a diagram for explaining the formation of a stacked multilayer structure related to one embodiment of the present invention.

Following this, an oxide layer is formed on a part of a conducting layer which is exposed on the side surface of each contact hole. For example, a thermal oxidization process is performed and an oxide layer is formed on a part of a conducting layer which is exposed on the inside of each contact hole. As a result, as shown in FIG. 13, for example, an oxide layer 2302 is formed on the part of the conducting layer 111 which is exposed on the side surface of the contact hole 2201. However, because generally, the process of forming an oxide film proceeds isotropically, an oxide layer is also formed at the bottom surface of the contact hole. For example, an oxide layer 2301 is also formed in the part of the conducting layer which becomes the bottom surface of the contact hole 2202. Then, anisotropic etching process such as RIE is performed and the oxide layer 2301 of the conducting layer at the bottom surface part of the contact hole is removed. As a result, the structure shown in FIG. 14 is obtained.

In addition, the volume of an oxide layer often becomes larger than the original volume of a conducting layer which is oxidized by thermal processing. Then, the shape of a contact hole becomes a shape heaving up in which the surface of oxide layers swell to the center of a contact hole compared with the surface of insulating layers.

Figure 16:
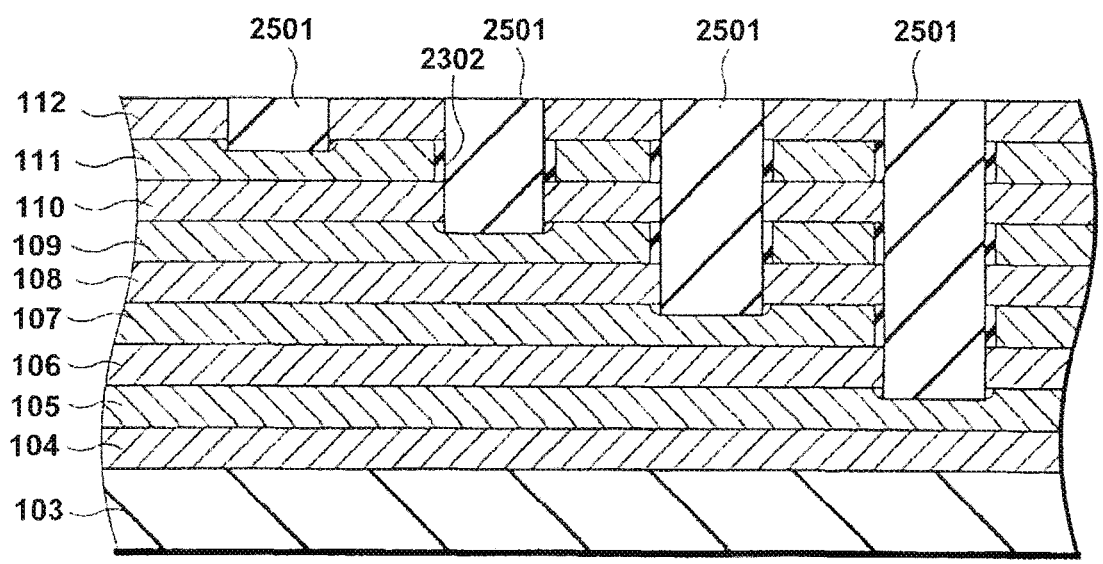
FIG. 16 is a diagram for explaining the formation of a stacked multilayer structure related to one embodiment of the present invention.

Then, a contact metal plug (for example, the later labeled 2401 in FIG. 15), which is made of, for example, tungsten or silicon which has been doped with phosphorus, is deposited inside the contact holes 2001, 2101, 2201 and 2202. After the deposition of contact metal plug, the upper surface of the stacked multilayer structure is planarized by CMP (Chemical Mechanical Polishing), for example (FIG. 16).

Because each oxide layer which is formed on each conducting layer at the side of a contact hole has insulating properties, each contact is connected electronically only to the conducting layer which is at the bottom of that contact. In addition, because the oxide layer 2302 is formed by thermal oxidization, it has a good adhesion property with a conductor. Therefore there is little possibility in which the oxide layer is stripped off from the conducting layer at the time of depositing a contact metal plug.

Here, because the topmost layer of the stacked multilayer structure is composed of the single layer as the insulating layer 112 or the insulating layer 114 formed as a protection layer, there is little possibility for dishing phenomena to occur during the CMP process. As a result, crumbling, for example, of the pattern of wires on the topmost layer hardly occur.

Furthermore, in FIG. 10 to FIG. 16, the side surface of the contact holes which are formed by etching are shown to be perpendicular to the bottom substrate. However, actually, the contact holes may also have a barrel shape in which the hole expands on half-way, or a taper shape in which the diameter of the hole becomes larger towards the top of the hole, or an opposite taper shape in which the diameter of the hole becomes larger towards the bottom of the hole. These shapes are not excluded from the embodiments of the present invention.

Fourth Embodiment

In the third embodiment describe above, by forming an oxide layer on the surface of a part of each conducting layer which a contact hole penetrates, it is possible to realize an insulation of one or more conducting layers other than the conducting layer at the bottom surface of a contact hole. Embodiments of the present invention are not limited to the realization of insulation of this type. A variety of methods are possible.

Figure 12:
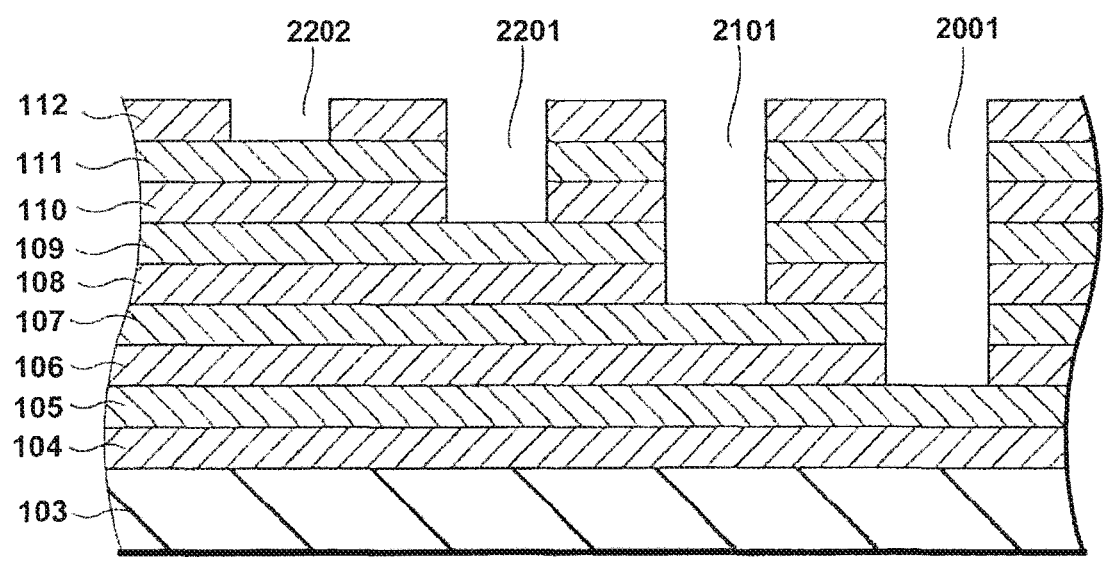
FIG. 12 is a diagram for explaining the formation of a stacked multilayer structure related to one embodiment of the present invention.
Figure 17:
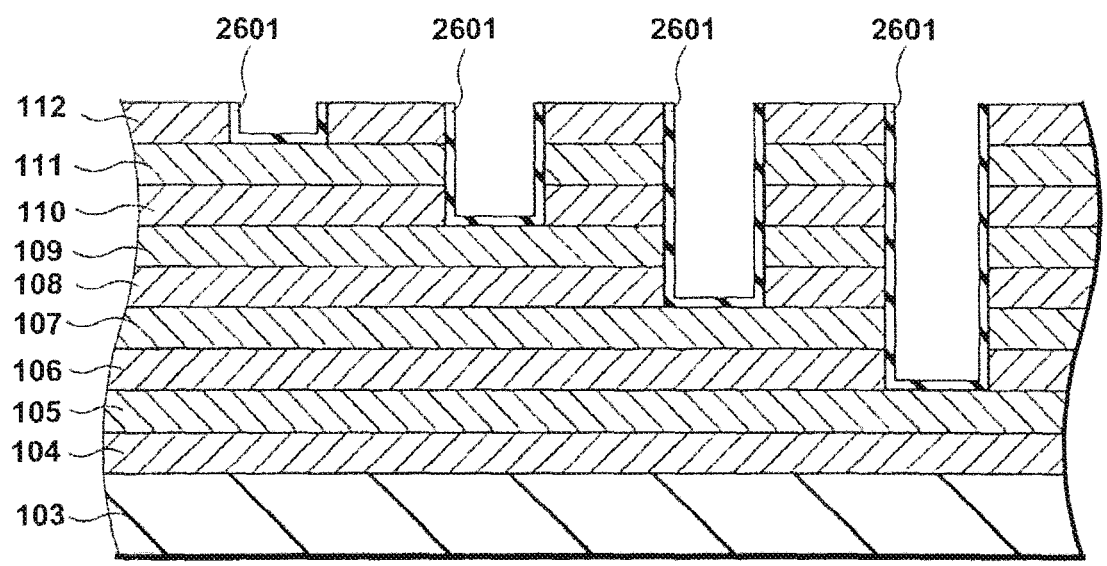
FIG. 17 is a diagram for explaining the formation of a stacked multilayer structure related to one embodiment of the present invention.

For example, after obtaining the structure shown in FIG. 12, instead of performing an oxidization process, an insulating film may be formed on the inside surface of each contact hole. It is possible to use CVD (Chemical Vapor Deposition) or ALD (Atomic Layer Deposition), for example, to form the insulating film of $SiO_2$ etc. As a result, as shown in FIG. 17, a structure is obtained in which the insulating film 2601 is formed on the inside surface of a contact hole.

Figure 18:
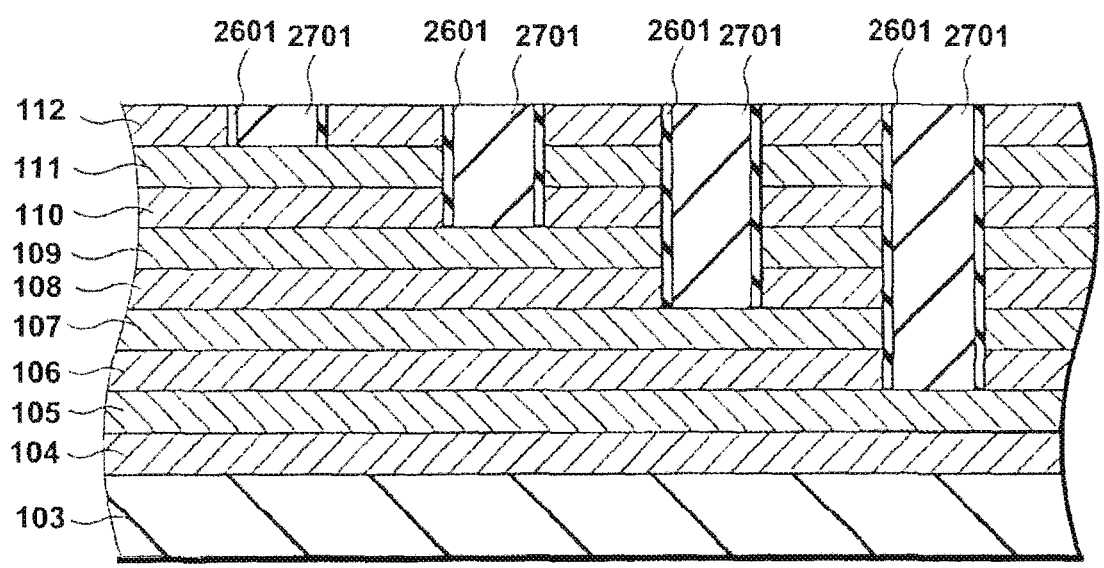
FIG. 18 is a diagram for explaining the formation of a stacked multilayer structure related to one embodiment of the present invention.

Following this, the bottom surface of a contact hole is anisotropically etched by, for example, RIE process, the conducting layer at the bottom surface is exposed, a contact metal plug is deposited and the contact 2701 is obtained as shown in FIG. 18. In this way, it is possible to make each contact connected electronically to the bottom conducting layer and insulated from other conducting layers.

Fifth Embodiment

In the third and fourth embodiments, an explanation is mainly given so that contact holes are formed one by one. However, the scope of the present invention is not limited to this type of formation. For example, a plurality of contact holes which reach the same conducting layer may be simultaneously formed. I.e., two or more contact holes have the same depth at this stage. Then, in each of one part of these contact holes, which may be roughly half of them, another contact hole is formed to reach a lower conducting layer. Aside this example, there are, for example, contact hole $H_1$ and contact hole $H_2$, and $H_1$ and $H_2$ reach different conducting layers, and if there is a need to form contact holes which is in contact with conducting layers which is N layers lower than the layers $H_1$ and $H_2$ reach, further contact holes may be formed simultaneously penetrating the bottom surfaces of $H_1$ and $H_2$.

Figure 19:
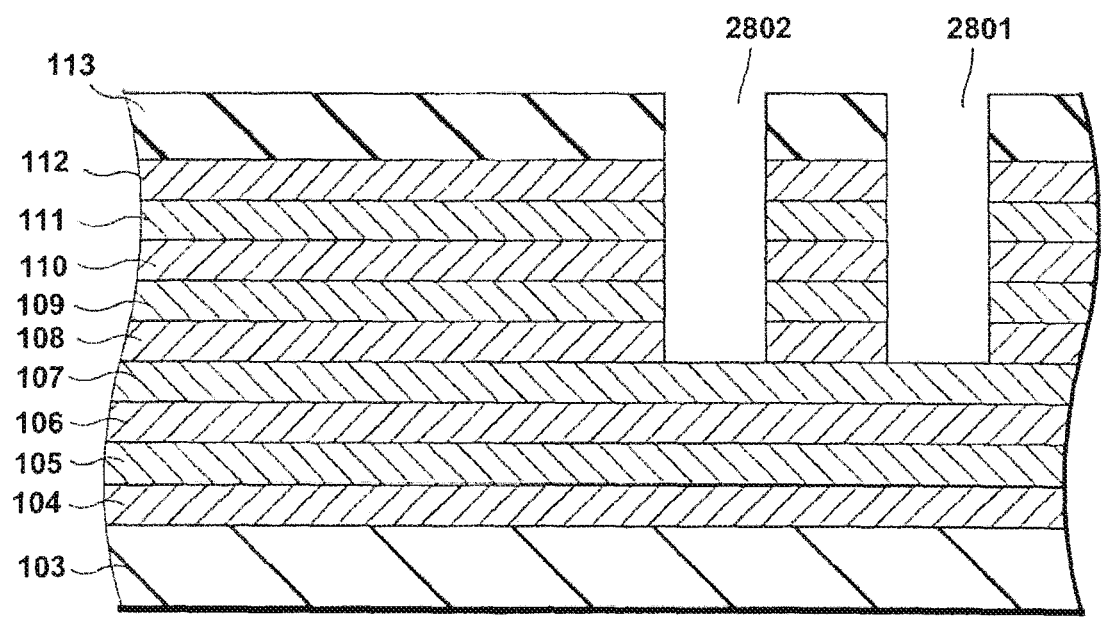
FIG. 19 is a diagram for explaining, the formation of a stacked multilayer structure related to one embodiment of the present invention.

For example, after the stacked multilayer structure shown in FIG. 9 is obtained, by the same process as in the third embodiment, a mask is formed using a photo resist 113 as shown in FIG. 19, and the two contact holes 2801 and 2802 which reaches the conducting layer 107 are formed by the same etching process. Following this, the photoresist 113 is removed.

Figure 20:
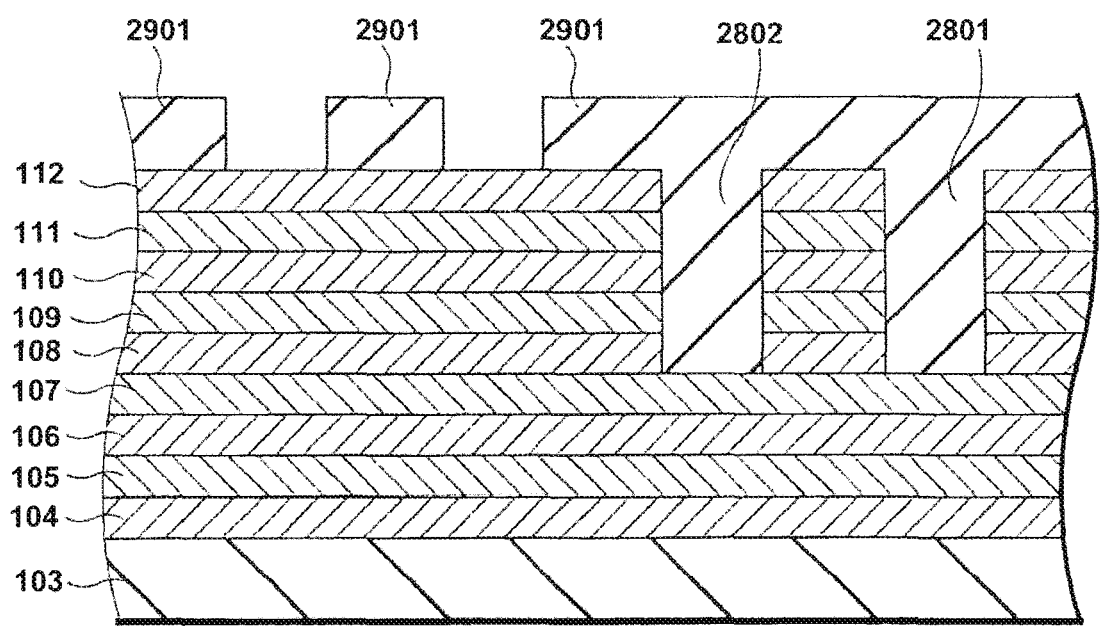
FIG. 20 is a diagram for explaining the formation of a stacked multilayer structure related to one embodiment of the present invention.

After this, a photoresist is deposited as shown in FIG. 20 so that the contact holes 2801 and 2802 are not etched further. Following this, a pattern is formed using a photoresist 2901 for forming two further contact holes by lithography.

Figure 21:
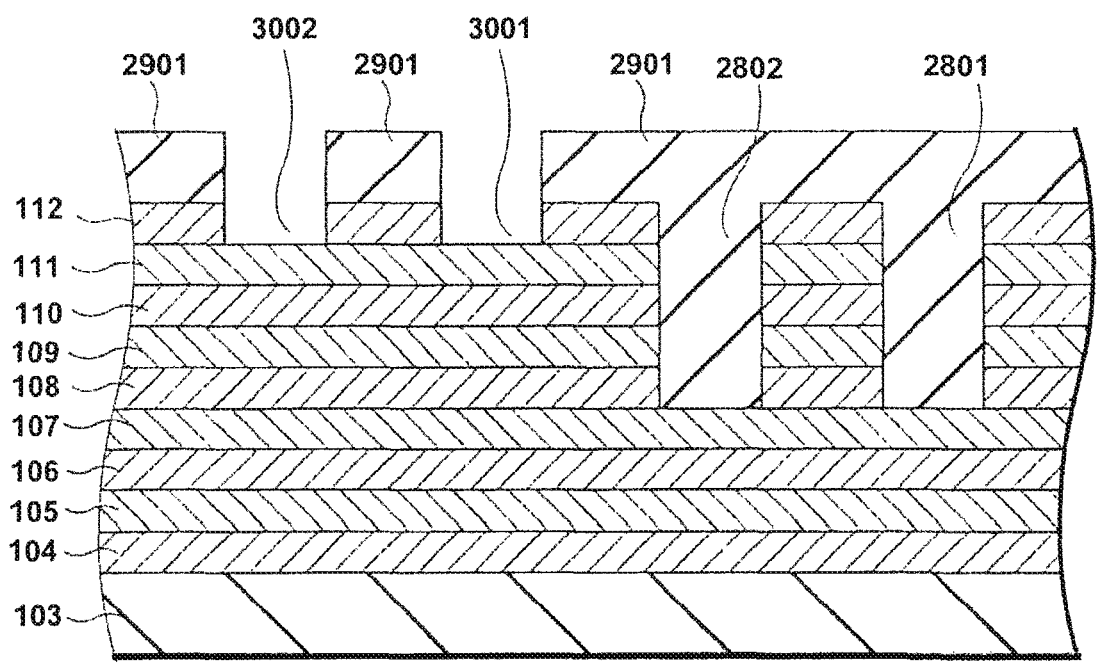
FIG. 21 is a diagram for explaining the formation of a stacked multilayer structure related to one embodiment of the present invention.

Then, the contact holes 3001 and 3002 which reach the conducting layer 111 are formed by the same etching process as shown in FIG. 21.

Figure 22:
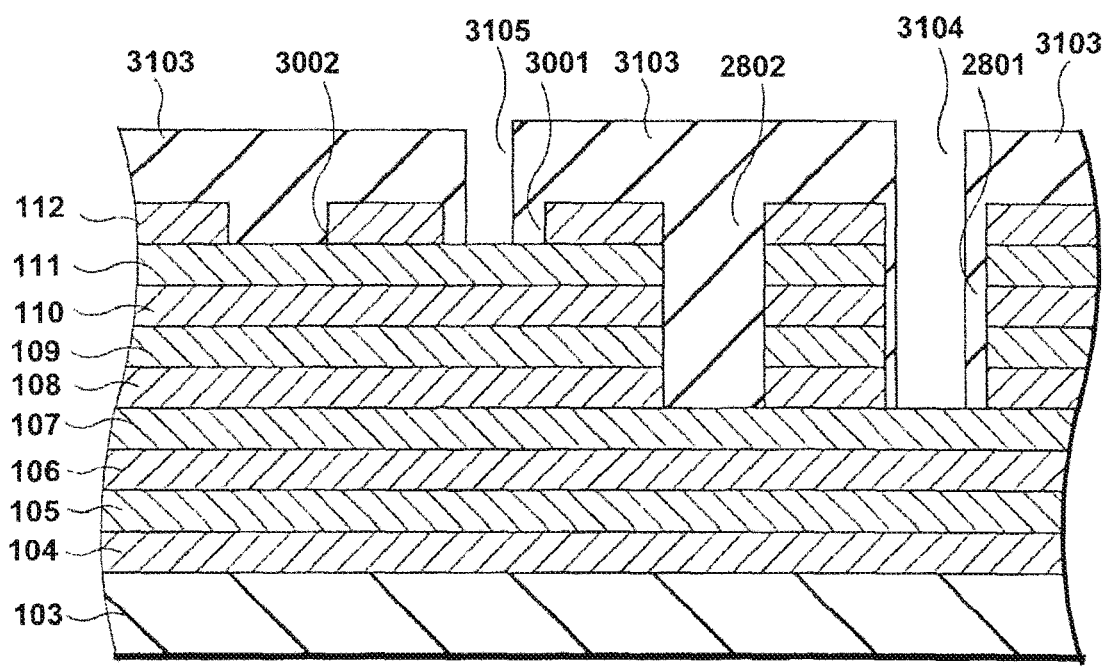
FIG. 22 is a diagram for explaining the formation of a stacked multilayer structure related to one embodiment of the present invention.

Following this, the photoresist 2901 is removed and another photoresist 3103 is deposited. Then, the contact hole patterns 3104 and 3105 are formed using the photoresist as shown in FIG. 22, so that two contact holes each of which will reach yet a lower conducting layer are formed from the bottom surfaces of the contact holes 2801 and 3001 respectively. That is, the openings 3104 and 3105 which reach the bottom parts of the contact holes 2801 and 3001 are formed in the layer of the photoresist. The inner diameter and bottom surface respectively of the openings 3104 and 3105 may be formed to match the inner diameter and bottom surface respectively of the contact holes 2801 and 3001. They may, however, be different. In FIG. 22, the case where the inner diameter respectively of the openings 3104 and 3105 is smaller than the inner diameter respectively of the openings of 2801 and 3001 respectively is shown.

Figure 23:
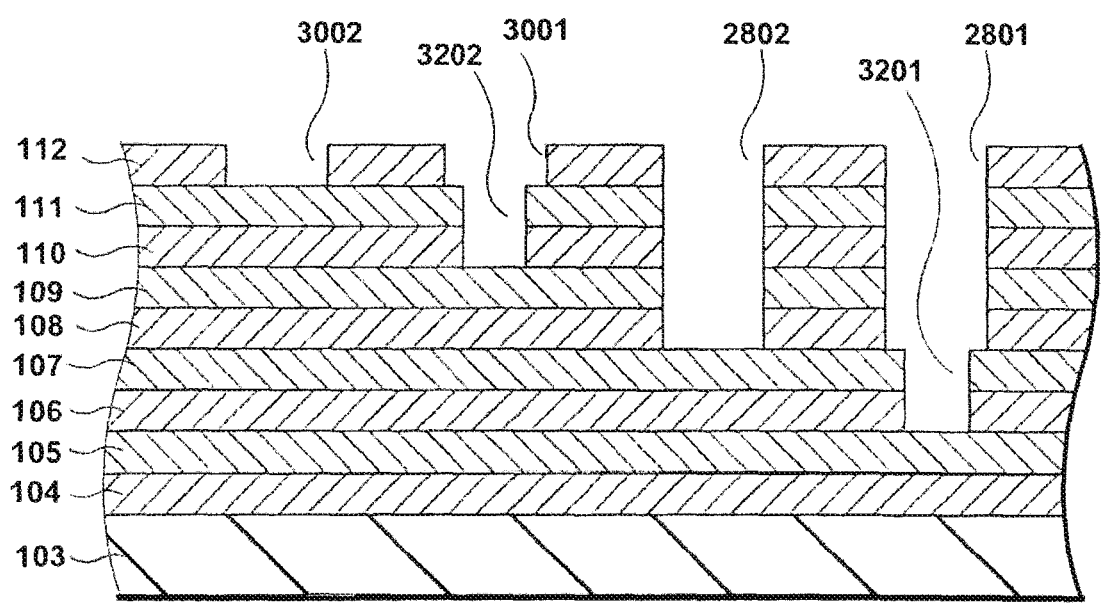
FIG. 23 is a diagram for explaining the formation of a stacked multilayer structure related to one embodiment of the present invention.

Then, an etching process in which from the bottom surface of each of contact holes 2801 and 3001, another contact hole which penetrate the insulating layer at the bottom surface of each of the contact holes 2801 and 3001 and reach the lower conducting layer. After this process, by removing the photoresist 3103, the contact holes 3001 and 3002 and the contact holes 2801 and 3201 which are sectioned into the upper part and lower part by the conducting layers 111 and 107 are obtained as shown in FIG. 23.

Figure 24:
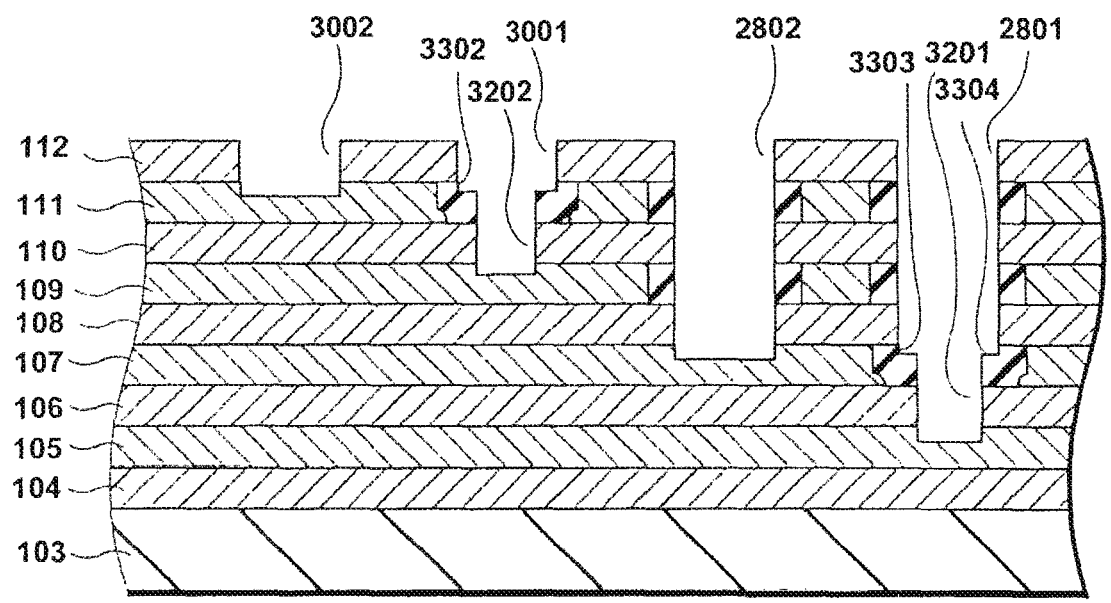
FIG. 24 is a diagram for explaining the formation of a stacked wire structure body related to one embodiment of the present invention.
Figure 25:
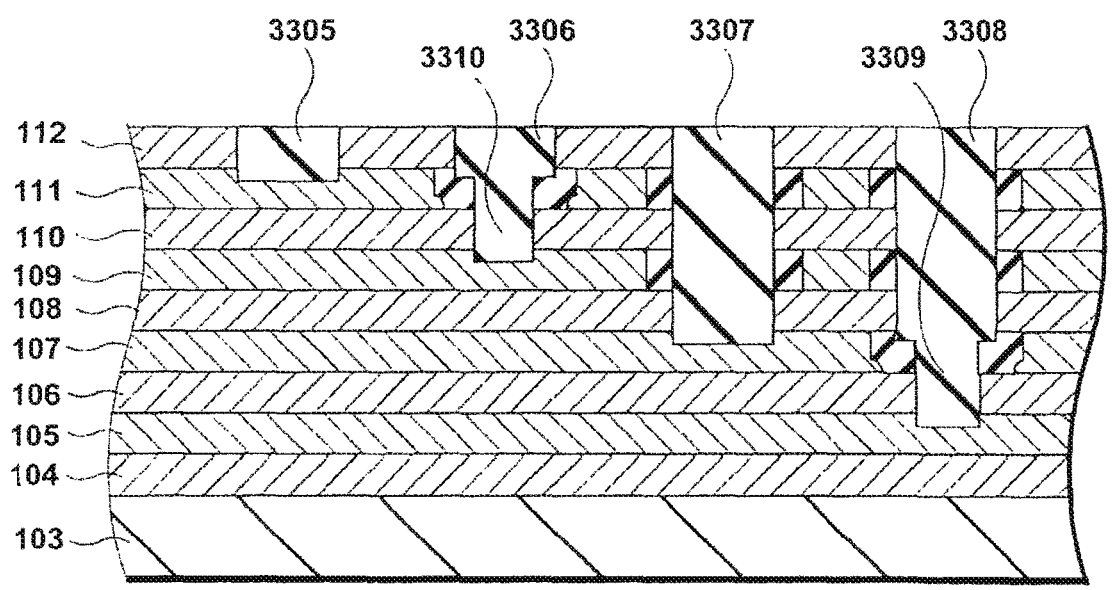
FIG. 25 is a diagram for explaining the formation of a stacked multilayer structure related to one embodiment of the present invention.

Following this, as in the first embodiment of the present invention, an oxide film is formed on the conducting layer exposed on the side surface of each contact hole. The thickness of the oxide film which is formed on the side surface is set so that it is thicker than the difference between the inner diameter of the contact holes 2801 and 3001 and the inner diameter of the contact holes 3201 and 3202 respectively. Etching process such as RIE is performed on the bottom surface of the contact hole and the oxide film is removed from the bottom surface. As a result, the structure as shown in FIG. 24 is obtained. The parts which are hatched such as the part with the symbol 3302 shows an oxide film.

As is shown in FIG. 24, when the oxide film which is formed on the bottom surface of the contact holes 2802, 3002, 3202 and 3304 is removed, the upper parts of the oxide film 3302 and 3303 which are simultaneously formed on the step part are somewhat removed. However, because the film thickness of the oxide films 3302 and 3303 is formed so that it may be thicker than the difference between the inner diameter of the contact holes 2801 and 3001 and the inner diameter of the contact holes 3202 and 3304 respectively, the insulating layer 3302 and 3303 still remain on the side surface which is in contact with the contact holes of the conducting layers 111 and 107 respectively. Furthermore, the thickness of the upper, part of the oxide films 3302 and 3303 which are removed is almost the same thickness as the oxide film which is formed on the bottom surface of a contact hole.

Following this, as in the third embodiment, a contact metal plug is deposited and the contacts 3305, 3306, 3307 and 3308 which conduct electrically only with the conducting layers at the bottom surface of these contacts, are formed by a process in which the upper part of the contact metal plug is planarized.

That is, the contact 3308 comprises (1) an upper part contact the bottom surface of which is in the middle of the conducting layer 107 and (2) an lower part contact the bottom surface of which in the middle of the conducting layer 105, and the inner diameter of the lower part contact is smaller than the inner diameter of the upper part contact. Further, the upper part contact is stacked on the lower part contact. There is a contact 3307 above the same substrate layer 103 which has almost the same inner diameter as the upper part contact of the contact 3308. The contact 3307 reaches the conducting layer 107. In addition, by increasing the number of stacked layers, a contact may have three separate parts, namely, an upper, middle, and lower contact and may be formed with many more parts. There may be many contacts above the same substrate layer 103 each having a different number of parts.

Figure 26:
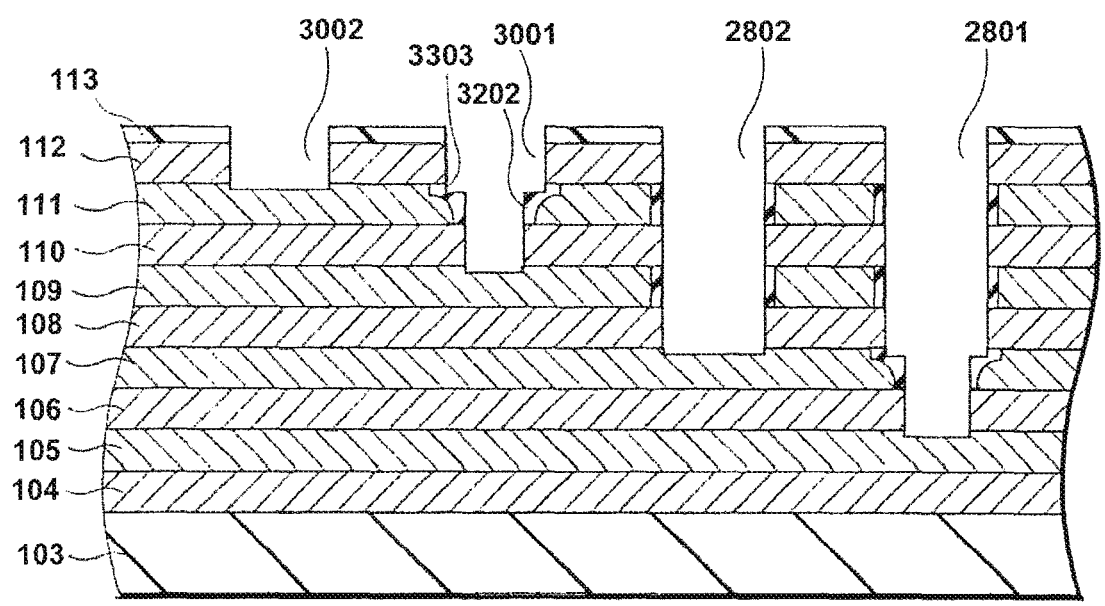
FIG. 26 is a diagram for explaining the formation of a stacked multilayer structure related to one embodiment of the present invention.

Also, as in FIG. 26, even in the case where the thickness of the oxide film 3303 which is formed on a side surface is not thicker than the difference between the inner diameter of the contact hole 3001 and the inner diameter of the contact hole 3202, by adjusting the amount of RIE etching and the thickness of the oxide film which is formed on the corner part 3303 of a conducting layer, it is possible to leave an oxide film on the side surface which reaches a contact hole of a conducting layer.

Figure 27:
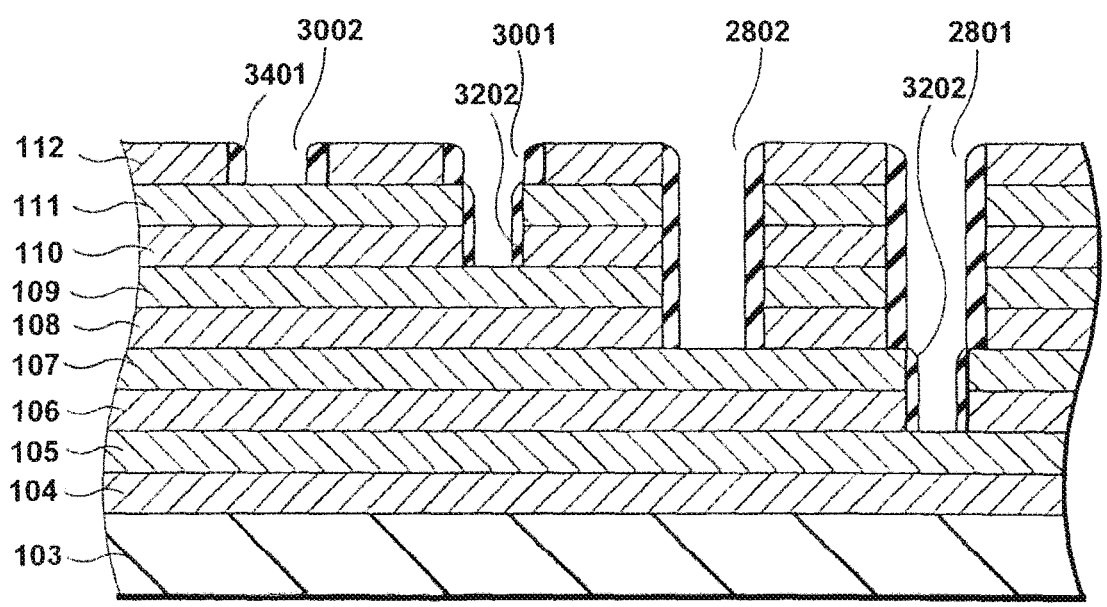
FIG. 27 is a diagram for explaining the formation of a stacked multilayer structure related to one embodiment of the present invention.

In addition, as shown in the fourth embodiment of the present invention, an insulating layer is formed on the inner side of a contact hole, and it is possible to remove the bottom insulating film by etching using RIE for example. In this case, the stacked multilayer structure shown in FIG. 27 is obtained as a stacked multilayer structure related to one embodiment of the present invention.

In this case, when removing the oxide film of the bottom surface of a contact hole, in order to leave an oxide film on the side surface of a conducting layer, it is preferred that the thickness of the oxide film 3401 which is formed on the side surface be formed so that it is thicker than, the difference between the inner diameter of the contact holes 2801 3001 and the inner diameter of the contact holes 3201 and 3202 respectively.

Figure 28:
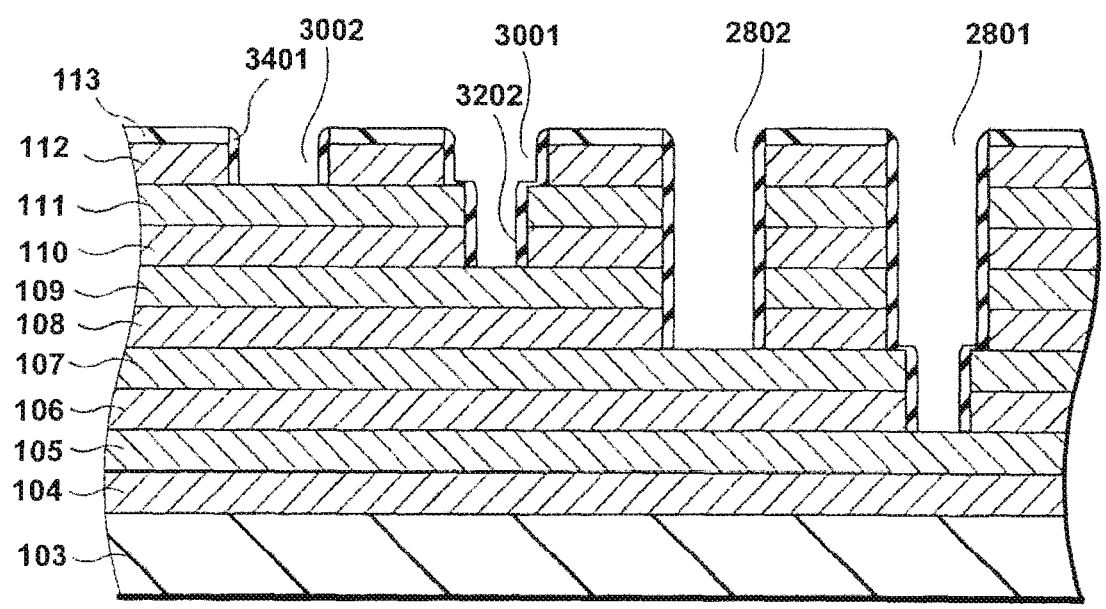
FIG. 28 is a diagram for explaining the formation of a stacked multilayer structure related to one embodiment of the present invention.

In addition, as shown in FIG. 28, even in the case where the thickness of the oxide film, which is formed on a side surface, is not thicker than the difference between the inner diameter of the contact hole 3001 and the inner diameter of the contact hole 3201, by adjusting the amount of RIE etching and the film thickness of the oxide layer, which is formed on the corner part of a conducting layer, it is possible to leave an oxide film on the side surface which is in contact with a contact hole of a conducting layer.

According to the present embodiment, several contact holes which reach the same conducting layer are formed simultaneously and a further contact hole is formed from the bottom surface of a contact hole among them so that the further contact hole reaches a different conducting layer. In this way, it is possible to obtain a stacked multilayer structure with a fewer number of processes which comprise depositing a photo resist, forming a pattern by photolithography and etching.

By selecting an order for forming contact holes it is generally possible to form contact holes on a stacked multilayer structure by a number of times of a logarithmic order of the number of contact holes which are to be formed (or the number of conducting layers). For example, assuming, eight contact holes are to be formed, the depth of a contact hole is represented as a natural number which showing how many layers the contact hole penetrates (zero represents a contact hole which is not formed yet), and the depths of eight contact holes are represented as a combination of eight natural numbers such as (a, b, c, d, e, f, g, h). First, four contact holes with a depth of five are formed and (0, 0, 0, 0, 5, 5, 5, 5) is obtained. Next, four contact holes with a depth of one are formed at a position where a contact hole is not formed and (1, 1, 1, 1, 5, 5, 5, 5) is obtained. Then, two contact holes with a depth of one and two contact holes with a depth of five are selected and two contact holes with a depth of two are formed on each respectively and (1, 1, 3, 3, 5, 5, 7, 7) is obtained. Then, one contact hole with a depth of one, one contact hole with a depth of three, one contact hole with a depth of five and one contact hole with a depth of seven are selected and a further contact holes with a depth of one is formed and (1, 2, 3, 4, 5, 6, 7, 8) is obtained. Therefore, eight contact holes are obtained in four times.

Alternatively, formation of four contact holes has been explained referring to FIG. 19 to FIG. 28 in the present embodiment, however, when expressed using the same notation, because they become (0, 0, 3, 3), (1, 1, 3, 3), (1, 2, 3, 4), four contact holes are obtained in three times. Therefore, while the number of contact holes is doubled from four to eight the number of times has only increase by one.

While, the shape of the side surface of a contact hole is shown as perpendicular to the substrate layer 103 in FIG. 23 for example, however, as stated above, the side surface may have a variety of shapes such as a barrel shape, a taper shape or an opposite taper shape. In addition, in the case where a further contact hole $H_4$ is formed from the bottom surface of the contact hole $H_3$, the shape of $H_3$ and $H_4$ can be different.

Sixth Embodiment

In the embodiments explained above, the inner diameter and the shape (for example, the bottom surface shape) of a contact hole has not been particularly referred to. If the inner diameter and the shape (for example, bottom surface shape) of a contact hole is the same, generally, the deeper a contact hole is the greater the electrical resistance becomes. When the electrical resistance is different between contacts there is a possibility that reliability may decrease and therefore it is preferred that any difference in electrical resistance between contacts be small or zero.

Thus, in the present embodiment, the diameter of contact holes and the shape of contact holes which reach lower conducting layers are enlarged and widened respectively. In other words, the diameter of contact holes and the shape of contact holes which are in contact with higher conducting layers are reduced and narrowed respectively.

Figure 29:
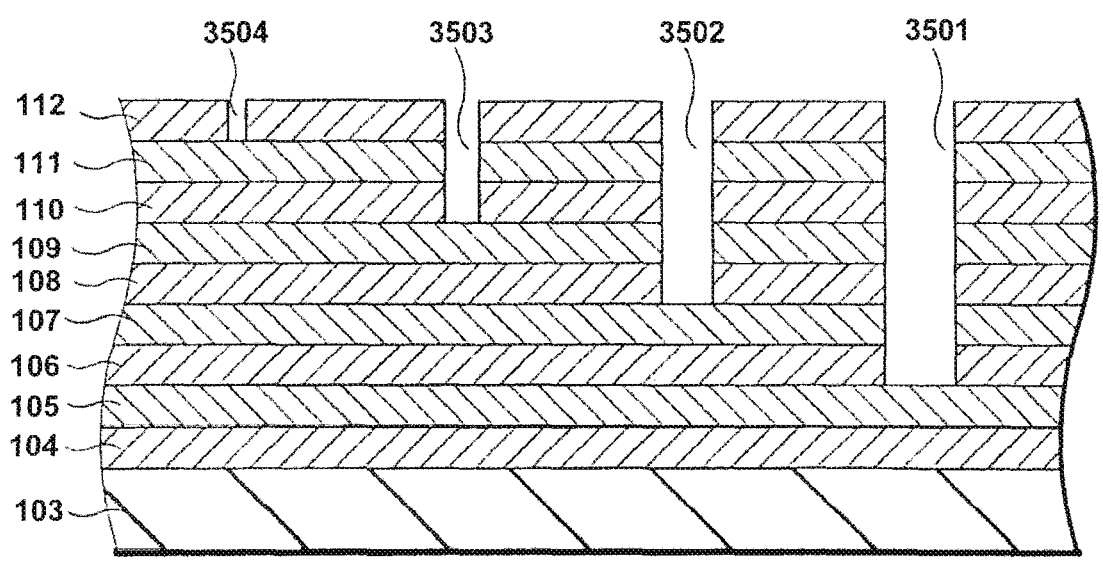
FIG. 29 is a diagram for explaining the formation of a stacked multilayer structure related to one embodiment of the present invention.

For example, assuming that in FIG. 29 the length of a plug of the contact hole 3501 is given as L, the length of a plug of the contact hole 3502 may be given as (¾) L, the length of a plug of the contact hole 3503 may be given as (²⁄₄) L and the length of a plug of the contact hole 3504 may be given as (¼) L and using the inner diameter of the contact hole 3501 as a base, the inner diameter of the contact hole 3502 is given as $[(\sqrt{3})/2]$, the inner diameter of the contact hole 3503 is given as $[(\sqrt{2})/2]$ and the inner diameter of the contact hole 3504 is given as [½] so that electrical resistance of each of contacts to be formed in the contact holes 3501, 3502, 3503, and 3504 is substantially the same.

The present embodiment of the present invention can also be applied to the fifth embodiment of the present invention. That is, it is possible to narrow not only the inner diameter of the upper part contact hole but also the lower part contact hole which is connected to a upper conducting layer. As a result, it is possible to reduce a difference in electrical resistance between contacts.

Seventh Embodiment

Instead of the manufacturing method of the stacked multilayer structure explained in the above embodiments the following manufacturing method may also be used.

The insulating layer 104, conducting layer 105, insulating layer 106, conducting layer 107, insulating layer 108, conducting layer 109, insulating layer 110, conducting layer 111, and the insulating layer 112 are stacked alternately on the substrate layer 103. For example, an oxide silicon layer of 70 nm thickness is formed as an insulating layer by a plasma CVD method and an amorphous silicon layer of 100 nm thickness is formed as a conducting layer. This is the same as in previous embodiments.

A photoresist layer is deposited on the topmost insulating layer 112 except for, for example, the right side part and etching as far as the lowest conducting layer 105 is performed. In this way, a first step of a stepped shape structure is formed.

Then, a slimming process, for example, is performed on the remaining photoresist layer which has been formed on the topmost insulating layer 112 and etching as far as the conducting layer 107 which is the second lowest conducting layer is performed. As a result, a second step of the stepped structure is formed. Furthermore, so that the exposed part of the conducting layer 105 is not etched any further, the exposed part etc. is covered by a photoresist.

The above sequence is repeated and a third and a fourth steps of the stepped structure are formed. Then, an interlayer insulating layer is deposited on the stepped structure and planarized by CMP, for example.

Following this, each contact hole which reach respective conducting layers is formed and contacts are formed. Thus, the contacts such that the diameters at the upper part are larger than the diameters at the lower part are formed

Eighth Embodiment

Figure 30:
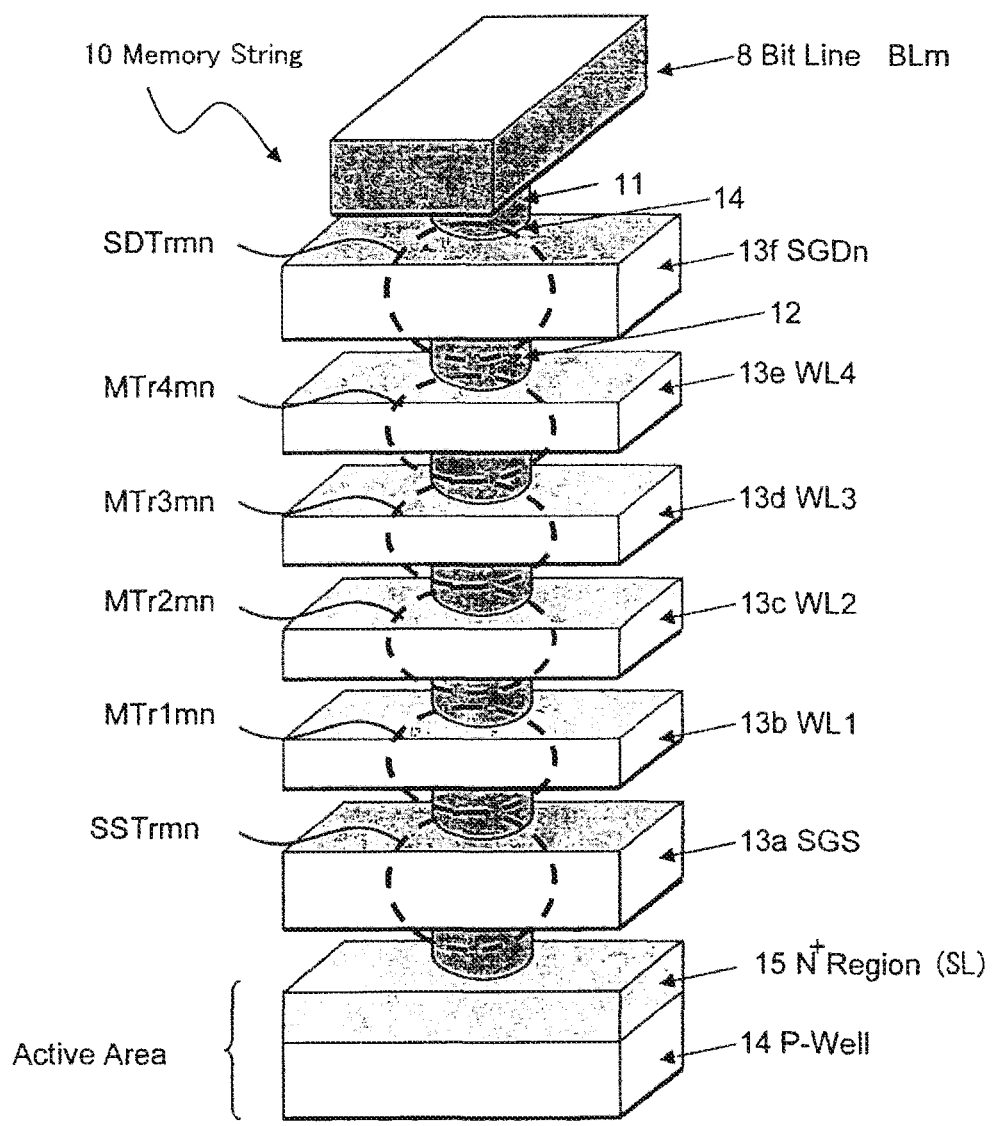
FIG. 30 shows a memory string of a non-volatile semiconductor memory device and its equivalent circuit which uses a stacked multilayer structure related to one embodiment of the present invention.

Next, elements which are formed on a nonvolatile semiconductor device which uses a stacked multilayer structure of an embodiment of the present invention is explained. FIG. 30 shows a memory string in a nonvolatile semiconductor device shown in FIG. 7 or FIG. 8. When a nonvolatile semiconductor device shown in FIG. 7 or FIG. 8 is generalized, it is possible to obtain a nonvolatile semiconductor device having m×n (m and n are natural numbers) memory strings which are formed in a matrix shape. It is possible to specify a position of each memory string using the number combination of a row and a column. Thus, a memory string at the m-th column and the n-th row are specified as an mn-th memory string.

The mn-th memory string 10 includes four memory transistors MTr1$mn$-MTr4$mn$ and two selection transistors SSTrmn and SDTrmn, and each are connected in series respectively. In one of the memory strings 10, a pillar shaped semiconductor 11 is formed on an N region which is formed on a P type region (P-Well region) above a semiconductor substrate. An insulating film 12 is formed around this and planar shaped (plate shaped) electrodes 13$a$-13$f$ are formed around this. These electrodes 13$a$-13$f$, the insulating film 12 and the pillar shaped semiconductor 11 form the memory transistors MTrmn-MTr4$mn$ and the two selection transistors SSTrmn and SDTrmn. It is possible to use an, oxide silicon film as the insulating film 12 of the selection transistors SSTrmn and SDTrmn. In addition, the insulating film 12 of the memory transistors MTr1$mn$-MTr4$mn$ includes an electron accumulation film and is a stacked film of, for example, an oxide silicon film/nitride silicon film/oxide silicon film. The electrodes 13$b$-13$e$ become the word lines WL1-WL4 (7) respectively, the electrode 13$f$ becomes the selection gate line SGDn and the electrode 13$a$ becomes the selection, gate line SGS. In addition, a bit line BLm8 is connected to one end of a source/drain of the selection transistor SGTrmn and a source line SL ($N^+$ region 15 in this embodiment) is connected to one end of a source/drain of the selection transistor SSTrmn.

Further, four memory transistors MTr are connected in series to one of the memory strings 10 and four examples of word lines 7 are shown, but it is not limited to this. The number of memory transistors which form one memory string can be decided according to the capacity of memory device.

The memory string 10 includes a pillar shaped semiconductor above an $N^+$ region (not shown in the diagram) which is formed on a P-well region 14 of a semiconductor substrate. The memory string 10 is arranged in a matrix on an inner surface which is perpendicular to the column shaped semiconductor. Further, this pillar shaped semiconductor may also be a circular pillar or a rectangular pillar. In addition, the pillar shaped semiconductor includes not only a symectric structure which is symmetrical around a central line but also includes a pillar shaped semiconductor having a step by step structure such as a stacked column shaped semiconductor having a different central line above a column shaped semiconductor having left-right symmetry.

Ninth Embodiment

Figure 31:
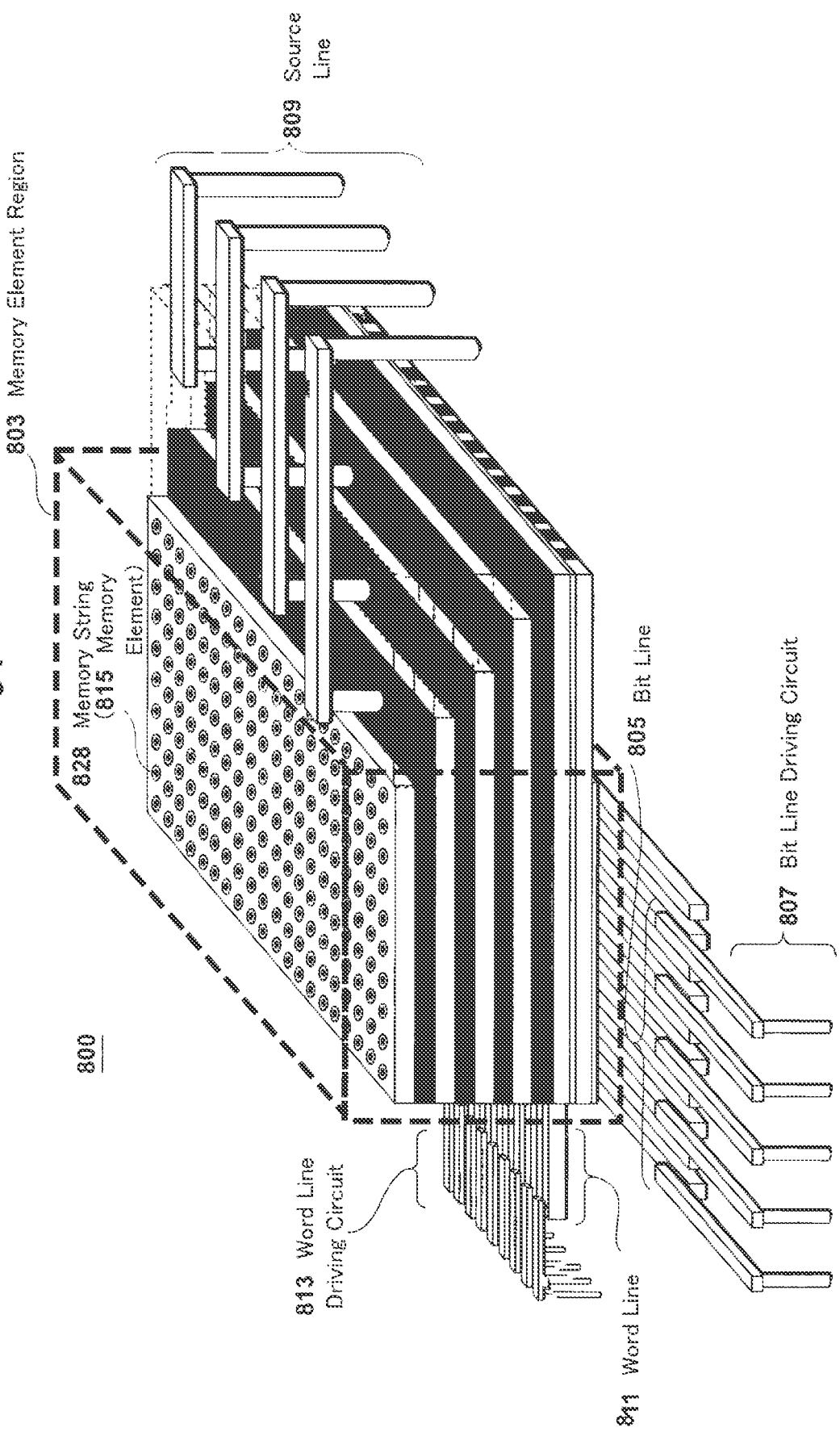
FIG. 31 shows an outline structure of a nonvolatile semiconductor memory device which uses a stacked multilayer structure related to one embodiment of the present invention.

FIG. 31 shows an outline structural diagram of a different nonvolatile semiconductor device which uses a stacked multilayer structure related to one embodiment of the present invention. The nonvolatile semiconductor device 800 includes a memory element region 803, a plurality of bit lines 805, a bit line driving circuit 807, a plurality of source lines 809, a plurality of word lines 811, and a word line driving circuit 813. As is shown in FIG. 31, in the nonvolatile semiconductor device 800 the memory elements 815 which form the memory element region 803 are formed within a stacked part in which conducting layers and insulating layers are alternatively stacked. As is shown in FIG. 31, conducting layers which are connected to each source line 809 are spread out in two dimensions.

Some parts of the conducting layers and insulating, layers which project out from the right of the memory element region 803 in the nonvolatile semiconductor device 800 shown in FIG. 31 are drawn using dotted lines. This is to explain the structure of the contacts in the plate shaped conducting layers related to a embodiment of the present embodiment. Actually, the conducting layers and insulating layers which are above the lowest conducting layer extend about the same as the lowest conducting layer. That is, the conducting layers shown in grey extend as largely as the conducting layers 105, 107, 109 and 111 in FIG. 1, FIG. 3, FIG. 5 and FIG. 6. In addition, the insulating layers between each conducting layer and the lowest and the highest insulating layer extend as largely as the insulating layers 104, 106, 108, 110, and 112.

Each of the conducting layers which are connected to each source lines 809 has a planar structure which extends two-dimensionally at a certain level. In the nonvolatile semiconductor device 800 the direction of the electric current which flows to the memory element 815 is fixed. Thus, the nonvolatile semiconductor device 800 is sometimes called a unipolar operation nonvolatile semiconductor device. In addition, because the memory element 815 has a resistance change element which has a metal oxide, nonvolatile semiconductor device 800 is sometimes called an OxRRAM (Oxide Resistive RAM).

Figure 32:
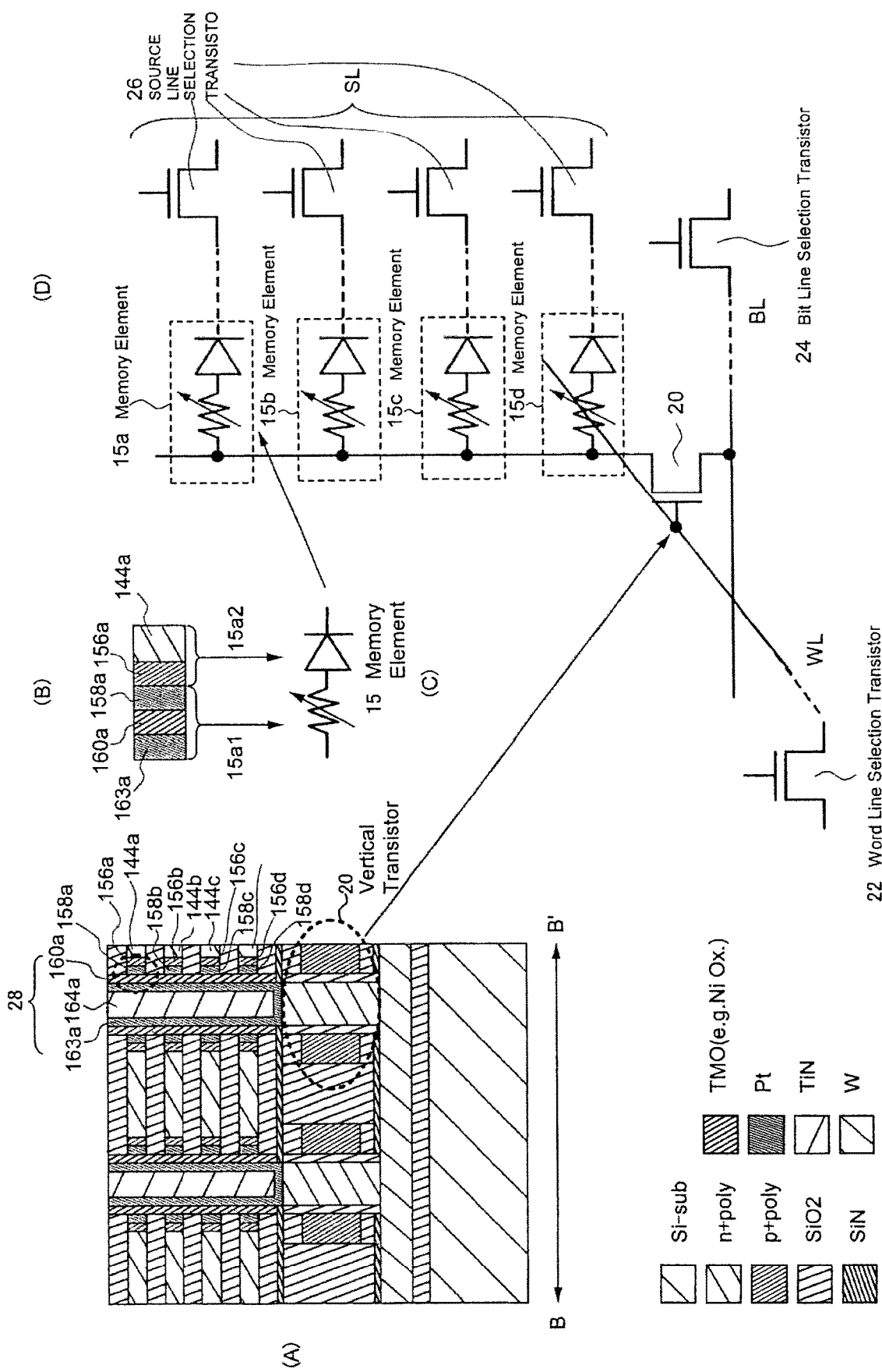
FIG. 32 shows a cross section of a memory element of a nonvolatile semiconductor memory device and its equivalent circuit which uses a stacked multilayer structure related to one embodiment of the present invention.

FIG. 32 (A) is a cross sectional view of one part of the memory element region 803 of the nonvolatile semiconductor device 800. FIG. 32 (B) is a partial enlarged view of the memory element 815 and FIG. 32 (C) is an equivalent circuit diagram of one part of the memory element 815. FIG. 32 (D) is a part of an equivalent circuit diagram of the nonvolatile semiconductor device 800. As is shown in FIG. 32 (A) the layers below the memory element region 803 of the nonvolatile semiconductor device 800 include vertical transistors 20. Four memory elements are stacked above the vertical transistors 20. In FIG. 32, the structure which forms the four memory elements 15 which are stacked above the vertical transistors 20 are called memory element string 28. The memory element region 3 of the non-volatile semiconductor device 800 includes, for example, 10×20=200 memory element strings 28, as is shown in FIG. 31.

The memory element string 28 include memory elements 15a-15d. The memory element 15a includes a metal film 163a, an oxide transition metal film 160a, a metal silicide film 158a, a shallow P type polysilicon film 156a, and an N type polysilicon film 144a. The memory element 15b includes a metal film 163a, an oxide transition metal film 160a, a metal silicide film 158b, a shallow P type polysilicon film 156b, and an N type polysilicon film 144b. The memory element 15c includes a metal film 163a, an oxide transition metal film 160a, a metal silicide film 158c, a shallow P type polysilicon film 156c, and an N type polysilicon film 144c. The memory element 15d includes a metal film 163a, an oxide transition metal film 160a, a metal silicide film 158d, a shallow P type polysilicon film 156d, and an N type polysilicon film 144d.

Each of the memory elements 15a-15d which form the memory element string 28 has a metal film 163a which is common to each memory element and one end of each of the memory elements 15a-15d is electrically connected by this metal film 163a. In addition, the n type polysilicon films 144a, 144b, 144c, and 144d are formed in a plate shape and form the conducting layers which are connected to each source line 809. In the memory element region 803 of the nonvolatile semiconductor device 800 related to the present embodiment, the memory element string have a commonly share the N type polysilicon films 144a, 144b, 144c, and 144d.

As is shown in FIG. 32 (D), the memory elements of the nonvolatile semiconductor device 800 have a resistance change element 15a1 which is formed from a metal film 163a, an oxide transition metal film 160a, and a metal silicide film 158a and also includes a diode 15a2 which is formed from a shallow p type polysilicon film 156a and an N type polysilicon film 144a and is connected to one end of the resistance change element 15a1. In other words, in the memory element 15a of the nonvolatile semiconductor device 800, the resistance change element 15a1 and the diode 15a2 are connected in series. Further, the memory element 15a may be thought of as being formed from the resistance change element 15a1 and the diode 15a2 being connected to one end of the memory element 15a which forms the resistance change element 15a1. The other memory elements 15b-15d include the same structure as the memory element 15a. Further, the memory element 15a of the nonvolatile semiconductor device 800 related to the present embodiment includes the diode 15a2 which is in a forward direction facing, a source line from the resistance change element 15a1 and the shallow p type polysilicon film 156a and the N type polysilicon film 144 a may be formed so that the diode 15a2 faces the opposite direction.

In the nonvolatile semiconductor memory device 800, the source line 809 is further connected to a source line selection transistor 26. This source line selection transistor 26 constitutes a driving circuit. As stated above, the conducting layers which are connected to the source line 809 are formed from a memory element of one memory element string and the same number of plate shaped conducting layers. In addition, the other end of the memory element 815 is connected to a bit is line 805 (BL) via a vertical transistor 20. A bit line selection transistor 24 is connected to one end the bit line 805 (BL). A signal is applied to the bit line 805 (BL) by this bit line selection transistor 24. A word line 811 (WL) is connected to a vertical transistor 20. A signal is applied to the word line 811 (WL) by the word line selection transistor 22.

Tenth Embodiment

Figure 33:
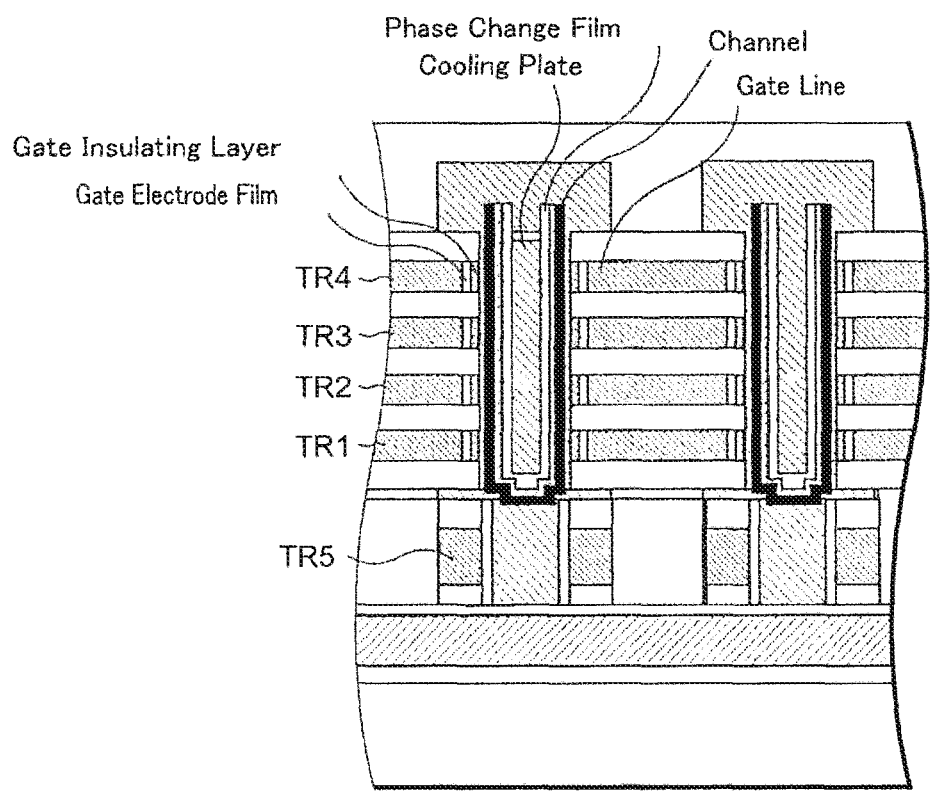
FIG. 33 shows a cross section of memory strings which are formed from a phase change type memory element of a nonvolatile semiconductor memory device which uses a stacked multilayer structure related to one embodiment of the present invention.

Another embodiment of a nonvolatile semiconductor memory device is disclosed. This nonvolatile semiconductor memory device also uses a stacked multilayer structure related to one embodiment of the present invention which is formed by arranging three dimensionally phase change type memory elements which are capable of storing data based on a phenomenon in which a different electrical resistance occurs depending on whether a film such as Chalcogenide (GeSbTe), which is used in a Digital Versaile Disk, for example, is crystal or amorphous. FIG. 33 shows a cross sectional structure of memory strings which are formed by a phase change type memory element. In FIG. 33, four phase change type memory cells TR1, TR2, TR3, and TR4 are formed on the upper part of a vertical transistor TR5. These phase change type memory cells include a cooling plate part at the center and a phase change type film via a surrounding film. The phase change type film is a film which is formed, for example, from the above stated GeSbTe. And, a channel is formed in each memory cell and a gate electrode film is formed via a gate insulating film in each memory cell. The gate electrode films are connected to the conducting layers. These conducting layers extend in two dimensionally (not shown in the diagram) and are stacked on each other. And, as is shown in FIG. 1, FIG. 3, FIG. 4, FIG. 5 and FIG. 6, a stacked multilayer structure of conducting layers is formed via the insulating layers and each conducting layer is connected to a driving circuit via the contacts which are formed there.

Figure 34:
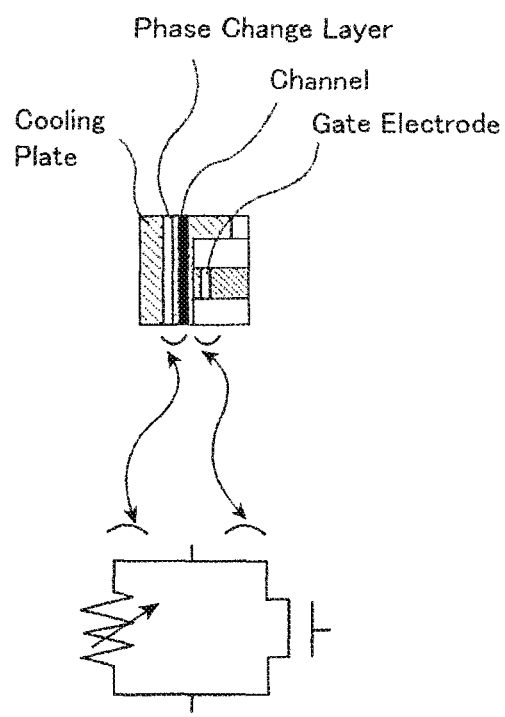
FIG. 34 shows a cross section view of a phase change type memory element of a nonvolatile semiconductor memory device and its equivalent circuit which uses a stacked multilayer structure related to one embodiment of the present invention.

FIG. 34 is a diagram which shows the relationship between a cross section of each phase change type memory cell and an equivalent circuit diagram of the phase change type memory cell. The phase change type film part operates as changeable resistance depending on a phase change and a channel, a gate insulating film, and a gate electrode film operate as a transistor.

Eleventh Embodiment

Until now, several structures of nonvolatile semiconductor memory devices having a structure in which memory transistors having a floating gate are arranged three dimensionally, are disclosed in FIG. 7 and FIG. 8, for example, and a structure of a nonvolatile semiconductor memory device having a structure in which resistance change elements having metal oxide film are arranged three dimensionally, is disclosed in FIG. 31 and a structure of a nonvolatile semiconductor memory device having a structure in which phase change memory cells are arranged three dimensionally is disclosed in FIG. 33. The semiconductor device which uses a stacked multilayer structure of one embodiment of the present invention is not limited to these memory elements. For example, there is also a nonvolatile semiconductor memory device which has a structure in which memory elements using a ferroelectric thin film material are arranged three dimensionally. In addition, a device can also be considered in which a movable structure is arranged three dimensionally. Such a movable structure may be formed using a process other than processes which are used in the manufacture of semiconductor integrated circuits. Examples of such devices comprise machine element parts, sensors, or actuators, by processing sacrifice film etching, which is commonly used in technology area which is applied to MEMS (Micro Electro Mechanical Systems) as a device which is not a device for memory. In the present invention, it is assumed that these movable structures are also included in a semiconductor element. The stacked multilayer structure related to one embodiment of the present invention, during the formation of these devices, contact holes are formed on a stacked multilayer structure of conducting layers and insulating layers which are connected to semiconductor elements which are arranged on the same level layer, and after performing an insulation process such as oxidization, a contact is formed and it becomes possible to connect conducting layers to a driving circuit, for example.

To sum up, a first stacked multilayer structure having a stacked layer part in which conducting layers and insulating layers are alternately stacked, a plurality of contact holes which are each in contact with a conducting layer and formed from the topmost insulating layer, and contacts which are formed in each of this plurality of contact holes is provided.

A second stacked multilayer structure in which a part of a conducting layer which becomes the side surface of a contact hole is oxidized in the first stacked multilayer structure is provided.

A third stacked multilayer structure having an element region which includes semiconductor elements which are formed within the stacked layer part after the stacked layer part is formed in the first stacked multilayer structure is provided.

A fourth stacked multilayer structure having an insulating film on the side surface of the contact in the third stacked multilayer structure is provided.

A semiconductor device which has one of a first, a second, or a third stacked multilayer structure is provided.

In addition, a first manufacturing method of a stacked multilayer structure in which conducting layers and insulating layers are alternately stacked, a plurality of contact holes each of which, is reaches each conducting layer are formed from the topmost insulating layer, a part of a conducting layer which becomes the side surface of a contact hole is oxidized, and contacts which are formed in each of this plurality of contacts is provided.

In this first manufacturing method, after forming a predetermined number of contact holes which reach one conducting layer, a part of this predetermined number of contact holes are be formed which reach a conducting layer which is one layer below this conducting layer.

In addition, it is also possible to provide a second manufacturing method of a stacked multilayer structure in which conducting layers and insulating layers are alternately stacked, a plurality of semiconductor elements in which an electrode is connected to each conducting layer, are formed, a plurality of contact holes which reach a conducting layer are formed from the topmost insulating layer, a part of a conducting layer which becomes a side surface of a contact hole is oxidized, and contacts are formed in each of this plurality of contact holes.

In addition, it is also possible to provide a third manufacturing method of a semiconductor device in which conducting layers and insulating layers are alternately stacked, a plurality of semiconductor elements in which an electrode is connected to each conducting layer, are formed, a plurality of contact holes which are each in contact with a conducting layer are formed from the topmost insulating layer, an insulating film is formed on a side surface of a contact hole and contacts are formed in each of this plurality of contacts.

In this second manufacturing method, after forming a predetermined number of contact holes which reach one conducting layer, a part of this predetermined number of contact holes are formed which reach a conducting layer which is one layer below this conducting layer.

What is claimed is:

1. A memory device comprising:
   a substrate;
   a first wiring extending in a first direction parallel to a surface of the substrate;
   a second wiring provided above the first wiring;
   a third wiring provided between the first wiring and the second wiring in a second direction, the second direction being perpendicular to the surface of the substrate;
   a fourth wiring extending in the second direction;
   a first variable-resistance part and a first rectifier part provided between the second wiring and the fourth wiring;
   a second variable-resistance part and a second rectifier part provided between the third wiring and the fourth wiring; and
   a first vertical transistor provided between the first wiring and the fourth wiring.

2. The memory device according to claim 1, wherein the first rectifier part is a diode.

3. The memory device according to claim 1, wherein the first rectifier part has a function preventing current from flowing in one direction.

4. The memory device according to claim 3, wherein the one direction is a direction from the first wiring to the fourth wiring.

5. The memory device according to claim 3, wherein the one direction is a direction from the fourth wiring to the first wiring.

6. The memory device according to claim 1, further comprising:
   a fifth wiring extending in a third direction, the third direction being perpendicular to the second direction and crossing the first direction,
   wherein a gate of the first vertical transistor is connected to the fifth wiring.

7. The memory device according to claim 6, further comprising:
   a sixth wiring extending in the second direction, the fourth wiring and the sixth wiring being arranged in the first direction;
   a third variable-resistance part and a third rectifier part provided between the second wiring and the sixth wiring;
   a fourth variable-resistance part and a fourth rectifier part provided between the third wiring and the sixth wiring; and a second vertical transistor provided between the first wiring and the sixth wiring.

8. The memory device according to claim 7, further comprising:
a seventh wiring extending in the third direction, the fifth wiring and the seventh wiring being arranged in the first direction,
wherein a gate of the second vertical transistor in connected to the seventh wiring.

9. The memory device according to claim 1, further comprising:
a first contact via extending in the second direction and connected to the second wiring; and
a second contact via extending in the second direction and connected to the third wiring, the first contact via and the second contact via being provided apart in the third direction.

10. The memory device according to claim 1, further comprising:
a first contact via extending in the second direction and connected to the second wiring; and
a second contact via extending in the second direction and connected to the third wiring, the first contact via and the second contact via being provided apart in the first direction.

11. The memory device according to claim 1, further comprising:
a first contact via extending in the second direction and connected to the second wiring; and
a second contact via extending in the second direction and connected to the third wiring, a length of the first contact via being smaller than a length of the second contact via in the second direction.

12. The memory device according to claim 11, further comprising:
a third contact via extending in the second direction and electrically connected to the first contact via; and
a fourth contact via extending in the second direction and electrically connected to the second contact via.

13. The memory device according to claim 12, wherein the third contact via and the fourth contact via are arranged in the first direction.

14. The memory device according to claim 13, further comprising:
a first transistor connected to the third contact via; and
a second transistor connected to the fourth contact via.

15. The memory device according to claim 1, further comprising:
a first transistor electrically connected to the second wiring; and
a second transistor electrically connected to the third wiring.

16. The memory device according to claim 15, wherein the first transistor and the second transistor are arranged in the first direction.

* * * * *

UNITED STATES PATENT AND TRADEMARK OFFICE
CERTIFICATE OF CORRECTION

PATENT NO. : 10,535,604 B2  
APPLICATION NO. : 16/014672  
DATED : January 14, 2020  
INVENTOR(S) : Makoto Mizukami et al.

Page 1 of 1

It is certified that error appears in the above-identified patent and that said Letters Patent is hereby corrected as shown below:

On the Title Page

Item (73), the Assignee's country is incorrect. Item (73) should read:
-- (73) Assignee: TOSHIBA MEMORY CORPORATION, Minato-ku (JP) --

Signed and Sealed this  
Third Day of March, 2020

Andrei Iancu  
*Director of the United States Patent and Trademark Office*